(12) United States Patent
Yoneda

(10) Patent No.: US 9,159,917 B2
(45) Date of Patent: Oct. 13, 2015

(54) NONVOLATILE MEMORY ELEMENT AND METHOD OF MANUFACTURING NONVOLATILE MEMORY ELEMENT

(71) Applicant: Panasonic Corporation, Osaka (JP)

(72) Inventor: Shinichi Yoneda, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 185 days.

(21) Appl. No.: 14/023,860

(22) Filed: Sep. 11, 2013

(65) Prior Publication Data

US 2014/0077144 A1 Mar. 20, 2014

(30) Foreign Application Priority Data

Sep. 14, 2012 (JP) ................................. 2012-202902

(51) Int. Cl.
*H01L 45/00* (2006.01)
*H01L 27/24* (2006.01)

(52) U.S. Cl.
CPC .......... *H01L 45/145* (2013.01); *H01L 27/2418* (2013.01); *H01L 27/2481* (2013.01); *H01L 45/08* (2013.01); *H01L 45/1233* (2013.01); *H01L 45/146* (2013.01); *H01L 45/1625* (2013.01); *H01L 45/1675* (2013.01); *H01L 45/1683* (2013.01)

(58) Field of Classification Search
CPC .............. H01L 45/122; H01L 45/1233; H01L 45/1246; H01L 45/146; H01L 45/1683
See application file for complete search history.

(56) References Cited

U.S. PATENT DOCUMENTS

| | | | |
|---|---|---|---|
| 7,692,178 B2 | 4/2010 | Kawashima et al. | |
| 7,919,774 B2 | 4/2011 | Kawashima et al. | |
| 8,022,502 B2 | 9/2011 | Kanzawa et al. | |
| 8,049,204 B2 | 11/2011 | Ito | |
| 8,058,636 B2 | 11/2011 | Osano et al. | |
| 8,217,489 B2 | 7/2012 | Osano et al. | |
| 8,389,972 B2 | 3/2013 | Mikawa et al. | |
| 8,394,669 B2 | 3/2013 | Arita et al. | |
| 8,437,173 B2 * | 5/2013 | Hayakawa et al. | ........... 365/148 |
| 8,445,319 B2 | 5/2013 | Kanzawa et al. | |

(Continued)

FOREIGN PATENT DOCUMENTS

| | | |
|---|---|---|
| JP | 2008-071786 | 3/2008 |
| WO | 2007/102483 | 9/2007 |

(Continued)

*Primary Examiner* — Allison P Bernstein
(74) *Attorney, Agent, or Firm* — Wenderoth, Lind & Ponack, L.L.P.

(57) ABSTRACT

A nonvolatile memory element includes: a first electrode; a second electrode; and a variable resistance layer between the first and second electrodes. The variable resistance layer having a resistance value that reversibly changes according to an electrical signal provided between the electrodes. The variable resistance layer includes a first variable resistance layer and a second variable resistance layer. The first variable resistance layer comprises a first metal oxide. The second variable resistance layer is planar and includes a first part and a second part. The first part comprises a second metal oxide and is planar. The second part comprises an insulator and is planar. The second metal oxide has a lower oxygen deficient degree than that of the first metal oxide. The first and second parts are in contact with different parts of a main surface of the first variable resistance layer which faces the second variable resistance layer.

11 Claims, 13 Drawing Sheets

(56) References Cited

U.S. PATENT DOCUMENTS

| | | |
|---|---|---|
| 8,492,743 B2 | 7/2013 | Mikawa et al. |
| 8,492,875 B2 | 7/2013 | Osano et al. |
| 8,618,526 B2 | 12/2013 | Sorada et al. |
| 8,854,864 B2 * | 10/2014 | Wei et al. ................ 365/148 |
| 8,861,257 B2 * | 10/2014 | Hayakawa et al. ........... 365/148 |
| 8,889,478 B2 * | 11/2014 | Mikawa et al. ............... 438/104 |
| 9,082,968 B2 * | 7/2015 | Mikawa et al. ....................... 1/1 |
| 2009/0014710 A1 | 1/2009 | Kawashima et al. |
| 2009/0250678 A1 | 10/2009 | Osano et al. |
| 2009/0283736 A1 | 11/2009 | Kanzawa et al. |
| 2010/0078615 A1 | 4/2010 | Ito |
| 2010/0200852 A1 | 8/2010 | Kawashima et al. |
| 2011/0220862 A1 | 9/2011 | Arita et al. |
| 2011/0220863 A1 | 9/2011 | Mikawa et al. |
| 2011/0294259 A1 | 12/2011 | Kanzawa et al. |
| 2012/0074369 A1 | 3/2012 | Osano et al. |
| 2012/0199805 A1 | 8/2012 | Sorada et al. |
| 2012/0235111 A1 | 9/2012 | Osano et al. |
| 2013/0140514 A1 | 6/2013 | Mikawa et al. |
| 2014/0110659 A1 * | 4/2014 | Murase et al. ................ 257/4 |
| 2014/0197368 A1 * | 7/2014 | Yoneda et al. ................ 257/2 |

FOREIGN PATENT DOCUMENTS

| | | |
|---|---|---|
| WO | 2008/102718 | 8/2008 |
| WO | 2008/126365 | 10/2008 |
| WO | 2008/149484 | 12/2008 |
| WO | 2011/007538 | 1/2011 |
| WO | 2011/030559 | 3/2011 |
| WO | 2012/023269 | 2/2012 |

* cited by examiner

NONVOLATILE MEMORY ELEMENT AND METHOD OF MANUFACTURING NONVOLATILE MEMORY ELEMENT

CROSS REFERENCE TO RELATED APPLICATIONS

The present application is based on and claims priority of Japanese Patent Application No. 2012-202902 filed on Sep. 14, 2012. The entire disclosure of the above-identified application, including the specification, drawings and claims is incorporated herein by reference in its entirety.

FIELD

One or more exemplary embodiments disclosed herein relate to nonvolatile memory elements and methods of manufacturing nonvolatile memory elements, and more particularly to a variable resistance nonvolatile memory element having a resistance value that varies depending on an applied voltage pulse and a method of manufacturing the nonvolatile memory element.

BACKGROUND

In recent years, with the advance of digital technologies, electronic devices, such as mobile information devices and information home appliances, have been provided with higher functions. There have therefore been increased demands for an increased capacity of a memory device, reduction of writing power, a higher speed of writing and reading, and a longer lifetime.

It is said that miniaturization of a flash memory including existing floating gates has a limit and fails to meet these demands. On the other hand, a variable resistance nonvolatile memory element having a variable resistance layer serving as a memory unit includes a variable resistance element having a simple structure sandwiched by a pair of electrodes. Therefore, it is expected that such a nonvolatile memory element has a possibility of further miniaturization, a higher speed, and further consumption power saving.

If a variable resistance layer serves as a memory unit, for example, application of an electric pulse or the like changes a resistance value of the variable resistance layer from high to low or from low to high. In this case, it is necessary to clearly distinguish between the two resistance values in low resistance and in high resistance, at the same time, stably change between low resistance and high resistance at a high speed, and then hold the two resistance values in the nonvolatile manner. In order to stabilize the memory characteristics and miniaturize the memory element, there have conventionally been various propositions.

For example, Patent Literature 1 discloses a nonvolatile memory element in which a variable resistance layer is provided between a pair of electrodes. The variable resistance layer has a multi-layer structure including a first variable resistance layer and a second variable resistance layer which comprise the same kind of transition metal oxide having different oxygen content atomic percentages. According to Patent Literature 1, the use of the nonvolatile memory element makes it possible to selectively cause oxidation-reduction reaction near an interface between an electrode and a variable resistance layer having a high oxygen content atomic percentage and, thereby providing stable resistance change.

CITATION LIST

Patent Literature

Patent Literature 1: International Publication No. 2008/149484

SUMMARY

Technical Problem

However, regarding the nonvolatile memory element having the conventional structure, there is a case where a resistance value of the variable resistance layer is very high in an initial state immediately after manufacturing the element and therefore normal resistance change does not occur. In this case, in order to change the nonvolatile memory element from the initial state to an operable state where normal resistance change stably occurs, processing so-called initial breakdown, for example, is necessary.

In the initial breakdown, a voltage having an amplitude much higher than an amplitude of a voltage used to cause normal resistance change in the operable state is applied to the nonvolatile memory element in the initial state, thereby forming a conductive path in the second variable resistance layer. The voltage required for initial breakdown of a nonvolatile memory element is referred to as a initial breakdown voltage.

For a nonvolatile memory element that requires the initial breakdown to be changed to the operable state, it is desired to perform the initial breakdown by applying a voltage as low as possible, in order to meet various requirements, such as reduction of a possibility of causing undesired electric breakdown in the nonvolatile memory element in the initial breakdown, efficiency of the initial breakdown, and elimination of a high voltage generation circuit dedicated to the initial breakdown.

Under the above-described circumstances, one non-limiting and exemplary embodiment provides a nonvolatile memory element capable of performing initial breakdown at a lower voltage than a voltage in the conventional technique, and a method of manufacturing such a nonvolatile memory element.

Solution to Problem

In one general aspect, the techniques disclosed here feature a nonvolatile memory element, including: a first electrode; a second electrode; and a variable resistance layer between the first electrode and the second electrode, the variable resistance layer having a resistance value that reversibly changes according to an electrical signal applied between the first electrode and the second electrode, wherein the variable resistance layer includes at least a first variable resistance layer and a second variable resistance layer, the first variable resistance layer comprises a first metal oxide, the second variable resistance layer is planar and includes a first part and a second part, the first part comprising a second metal oxide and being planar, and the second part comprising an insulator and being planar, the second metal oxide has a lower oxygen deficient degree than an oxygen deficient degree of the first metal oxide, and the first part and the second part of the second variable resistance layer are in contact with different parts of a main surface of the first variable resistance layer, the main surface facing the second variable resistance layer.

Advantageous Effects

In the nonvolatile memory element according to one or more exemplary embodiments or features disclosed herein, the second variable resistance layer is provided with the second part comprising an insulating material (insulator). The provision of the second variable resistance layer decreases a cross-sectional area of the first part comprising the second metal oxide, namely, an effective path for an operation current in the nonvolatile memory element.

Accordingly, in comparison to the conventional structure without having a part comprising an insulating material in the second variable resistance layer, the nonvolatile memory element according to the present discloser has a less leak current and a higher concentration of the operation current. Therefore, the nonvolatile memory element according to the present disclosure can perform initial breakdown at a lower voltage.

BRIEF DESCRIPTION OF DRAWINGS

These and other objects, advantages and features of the invention will become apparent from the following description thereof taken in conjunction with the accompanying drawings that illustrate a specific embodiment of the present disclosure.

Figure 2:
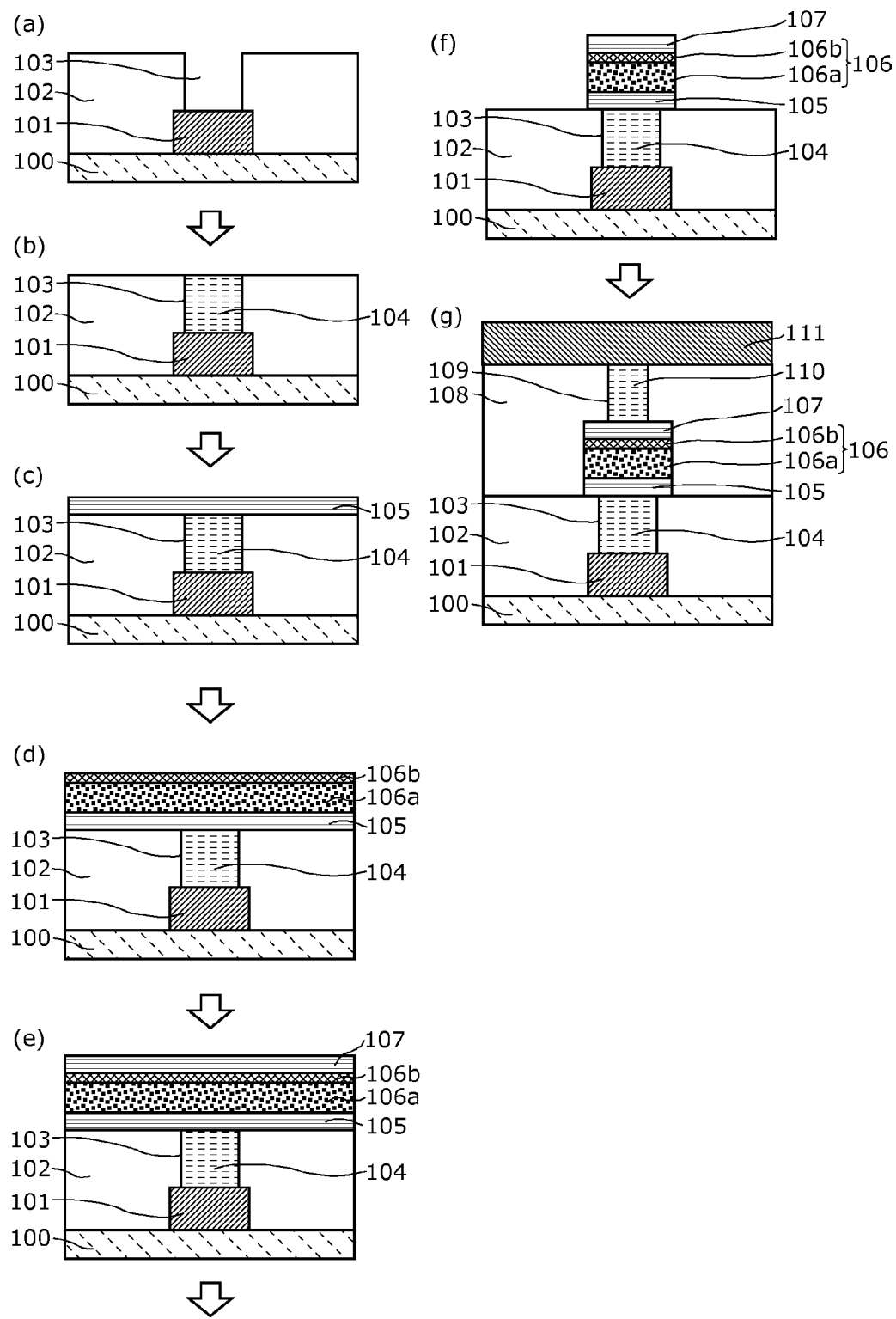

FIG. (a) to (g) in FIG. 2 are cross-sectional views showing a method example of manufacturing a main part of the conventional nonvolatile memory element.

Figure 3:
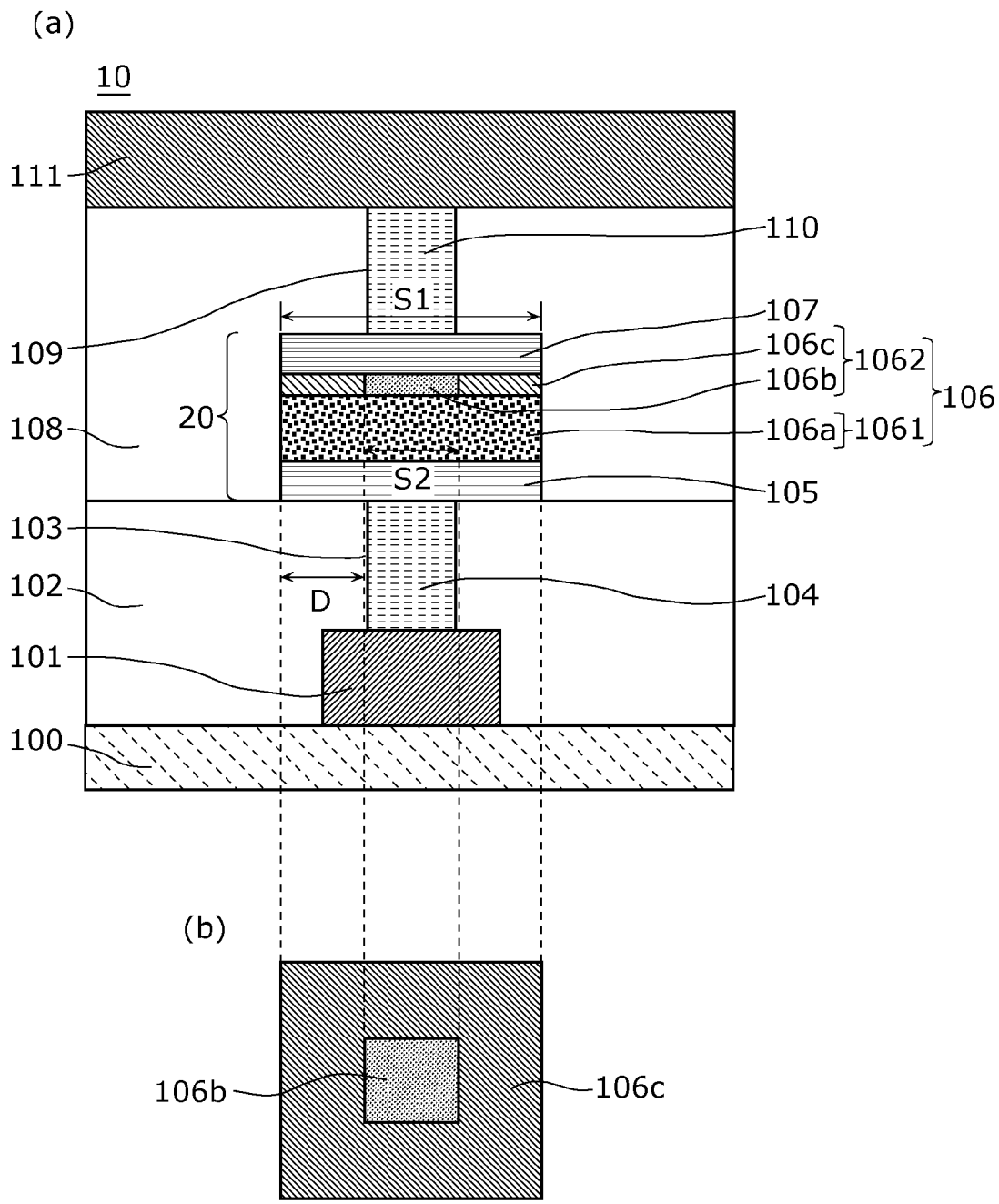

FIG. (a) in FIG. 3 is a cross-sectional view showing a structure example of a nonvolatile memory element according to an embodiment, and (b) in FIG. 3 is a plane view of a second variable resistance layer.

Figure 4:
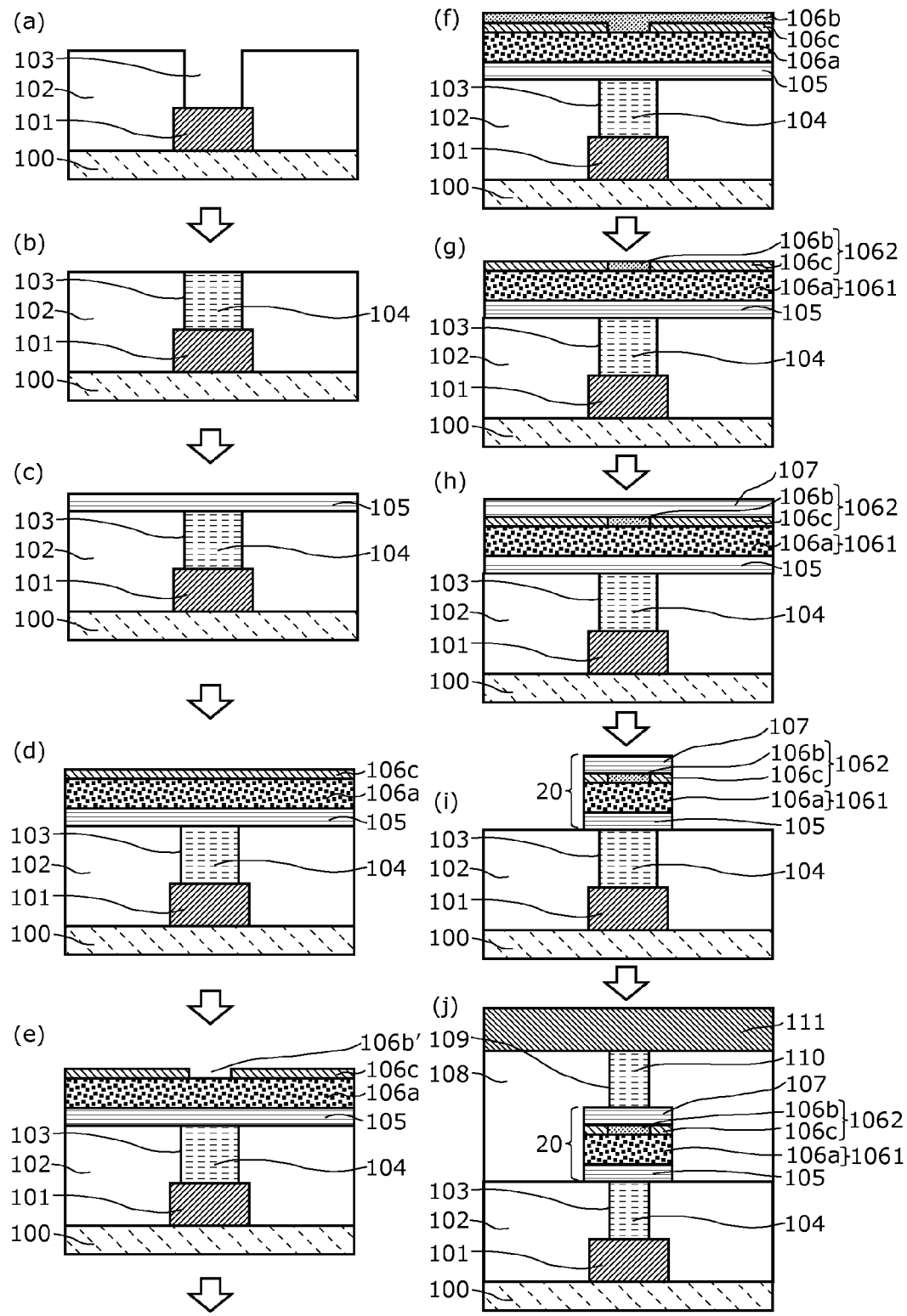

FIG. 4(a) to (j) in FIG. 4 are cross-sectional views showing a method example of manufacturing a main part of the nonvolatile memory element according to the embodiment.

Figure 5:
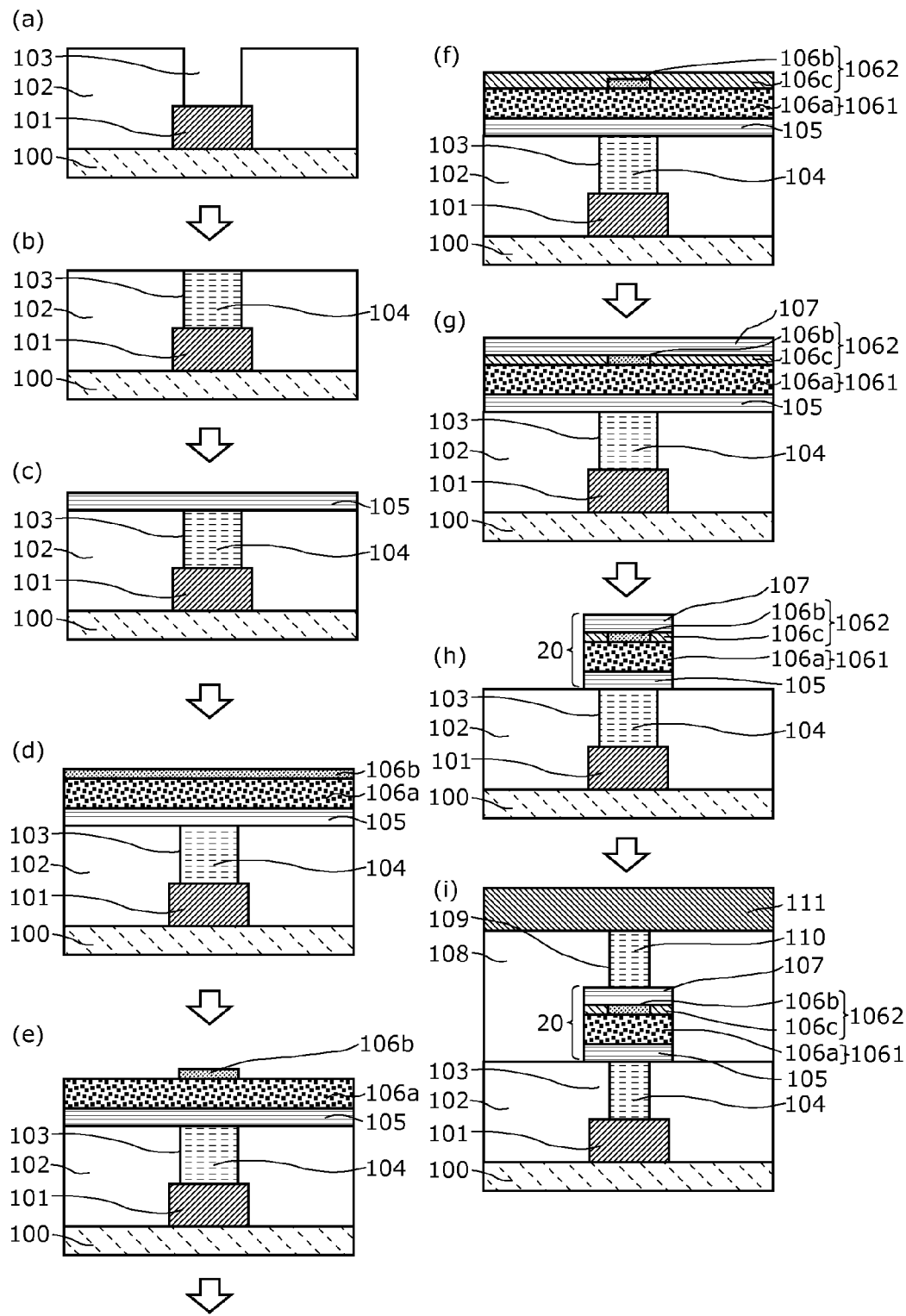

FIG. 5(a) to (i) in FIG. 5 are cross-sectional views showing another example of the method of manufacturing the main part of the nonvolatile memory element according to the embodiment.

Figure 6:
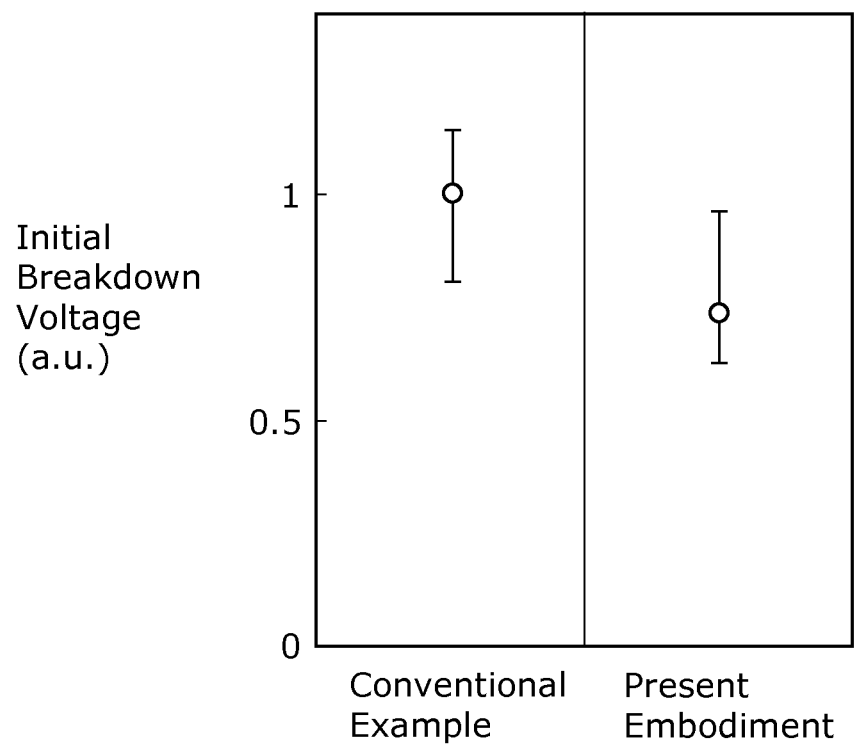

FIG. 6 is a graph plotting an initial breakdown voltage in the conventional example and an initial breakdown voltage in the nonvolatile memory element according to the embodiment.

Figure 7:
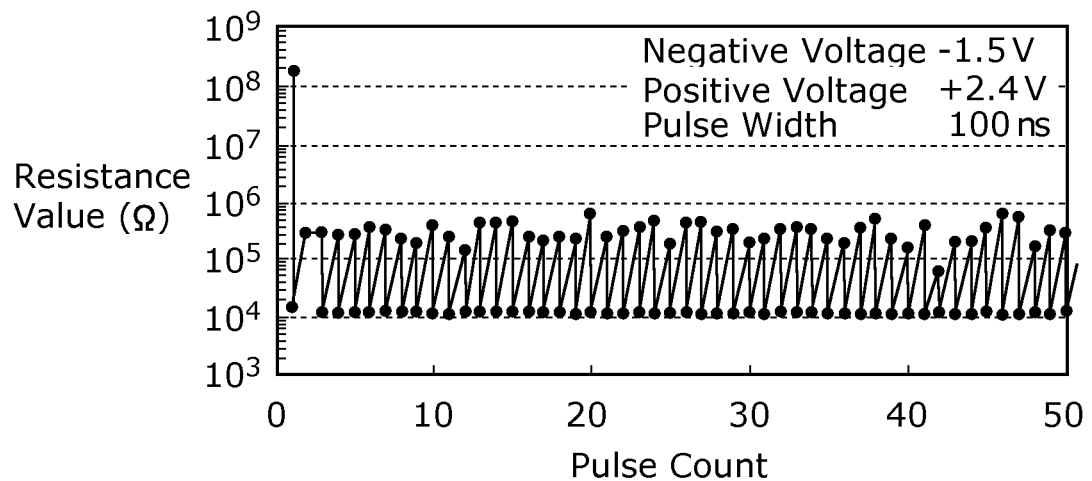

FIG. 7 is a graph plotting an example of a relationship between a resistance value and a pulse application count in the case where an electric pulse is applied to the nonvolatile memory element according to the embodiment.

Figure 8:
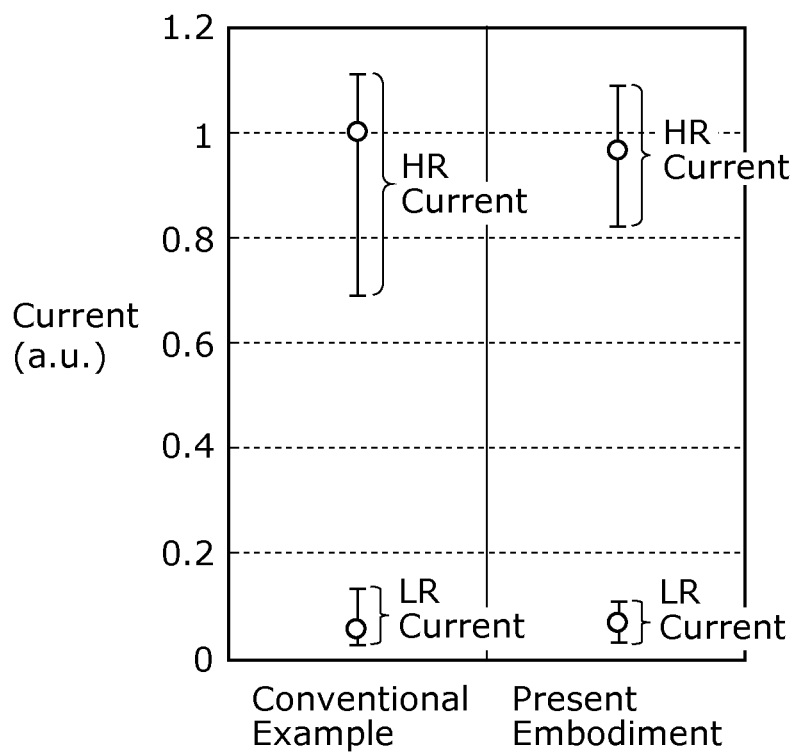

FIG. 8 is a graph plotting a distribution of an operation current in each of the conventional example and the nonvolatile memory element according to the embodiment.

Figure 9:
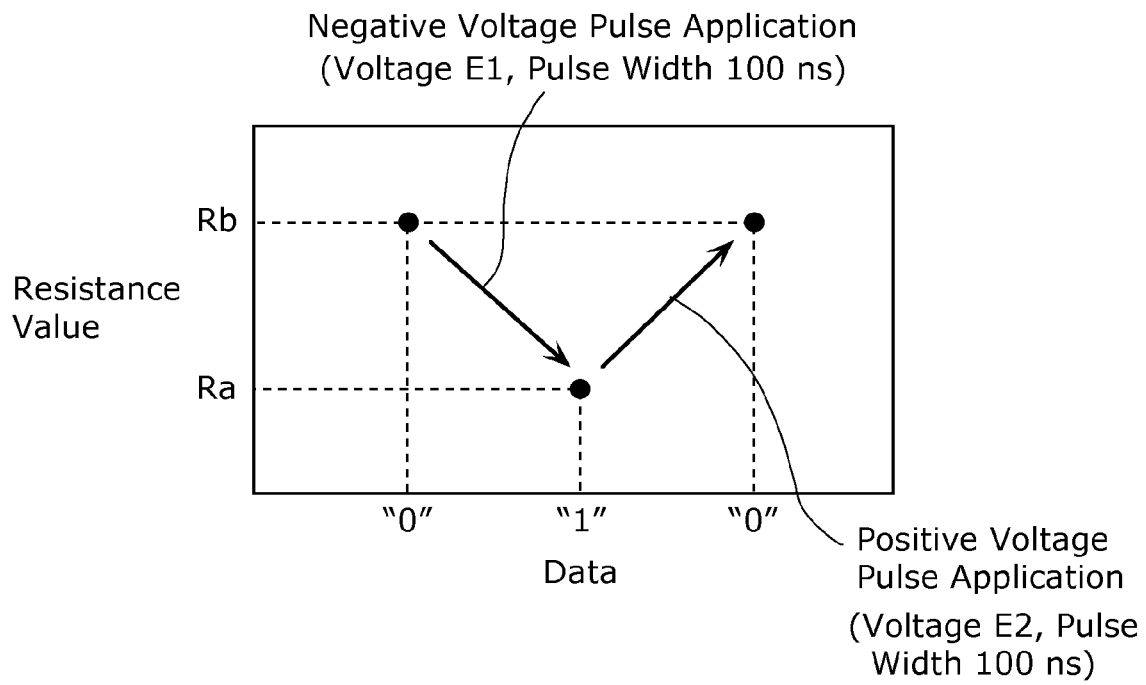

FIG. 9 is a graph plotting an operation example of writing data into the nonvolatile memory element according to the embodiment.

Figure 10:
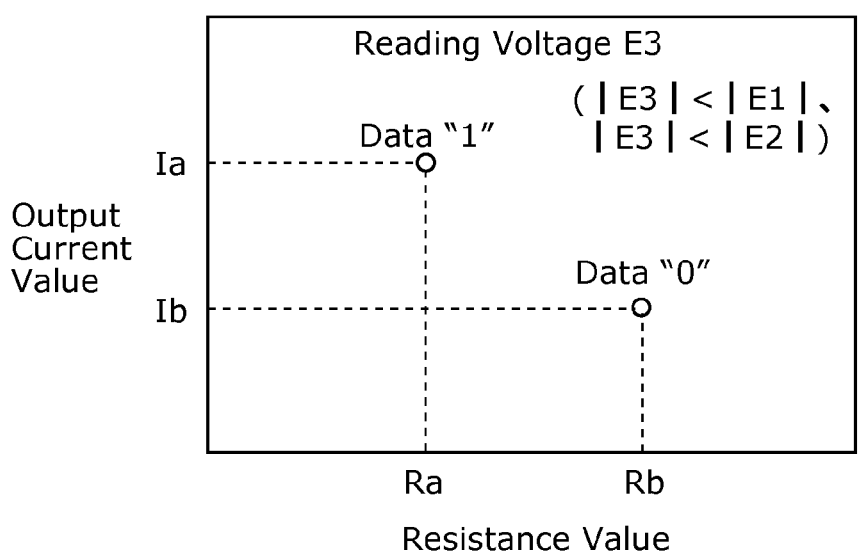

FIG. 10 is a graph plotting an operation example of reading data from the nonvolatile memory element according to the embodiment.

Figure 11:
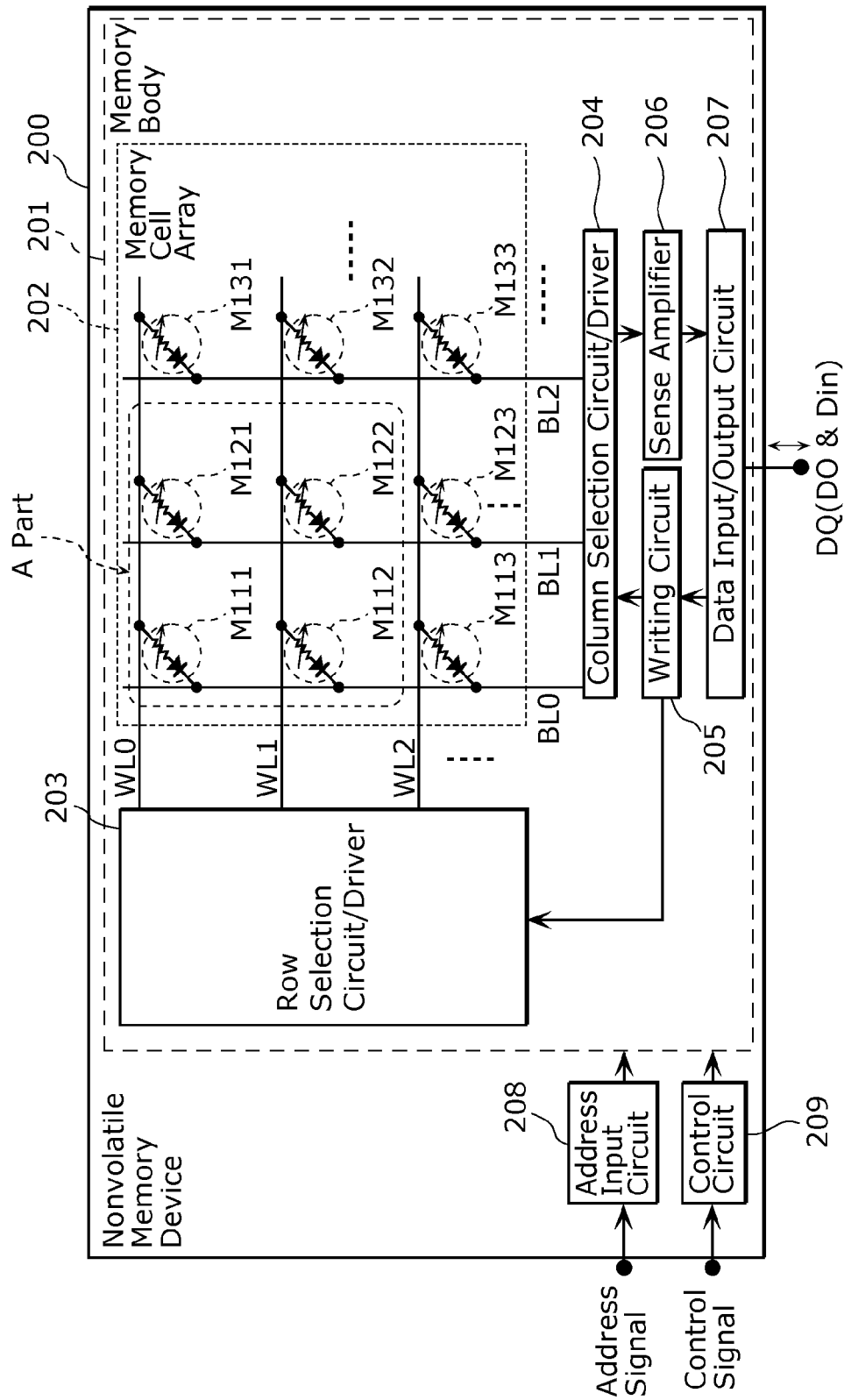

FIG. 11 is a block diagram of a structure example of a nonvolatile memory device including the nonvolatile memory elements according to the embodiment.

Figure 12:
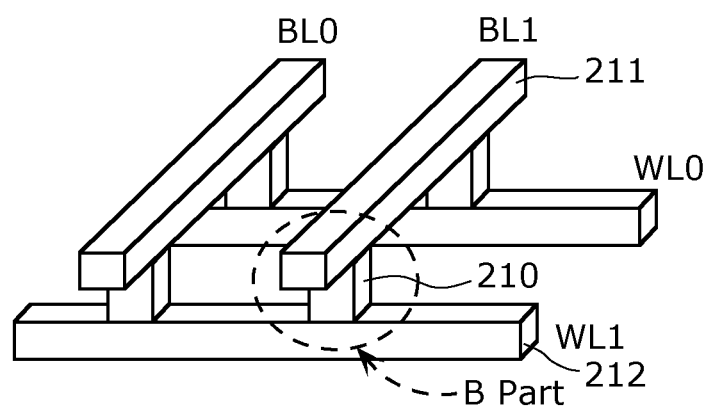

FIG. 12 is an oblique perspective view of a structure example of an A part (structure for four bits) in the nonvolatile memory device shown in FIG. 11.

Figure 13:
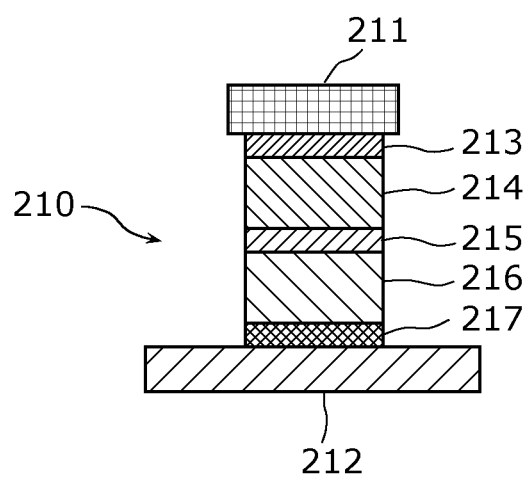

FIG. 13 is a cross-sectional view of a structure example of the nonvolatile memory element in the nonvolatile memory device shown in FIG. 11.

Figure 14:
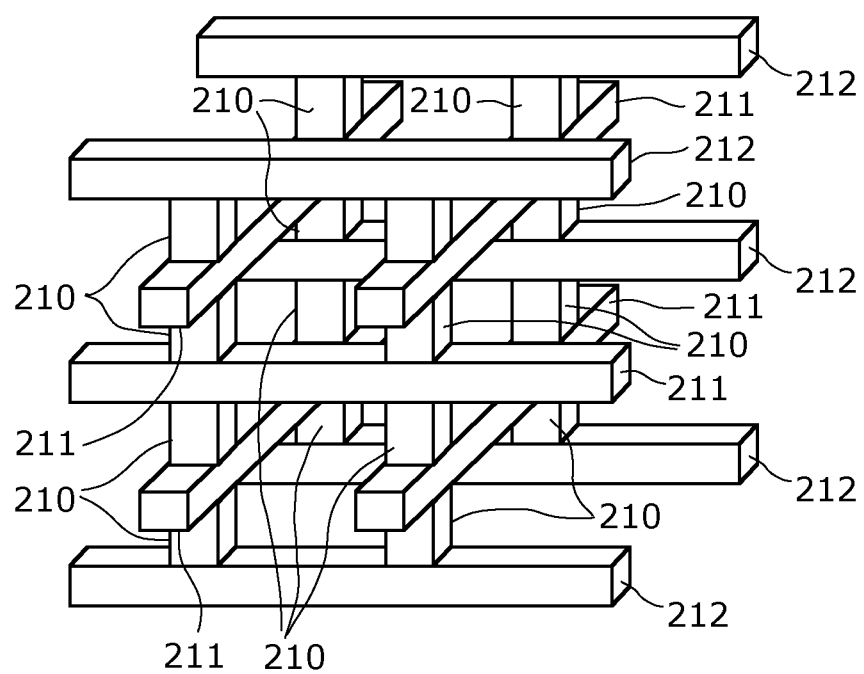

FIG. 14 is an oblique perspective view of a structure example of a memory cell array in a multi-layer structure of the nonvolatile memory devices shown in FIG. 11.

Figure 15:
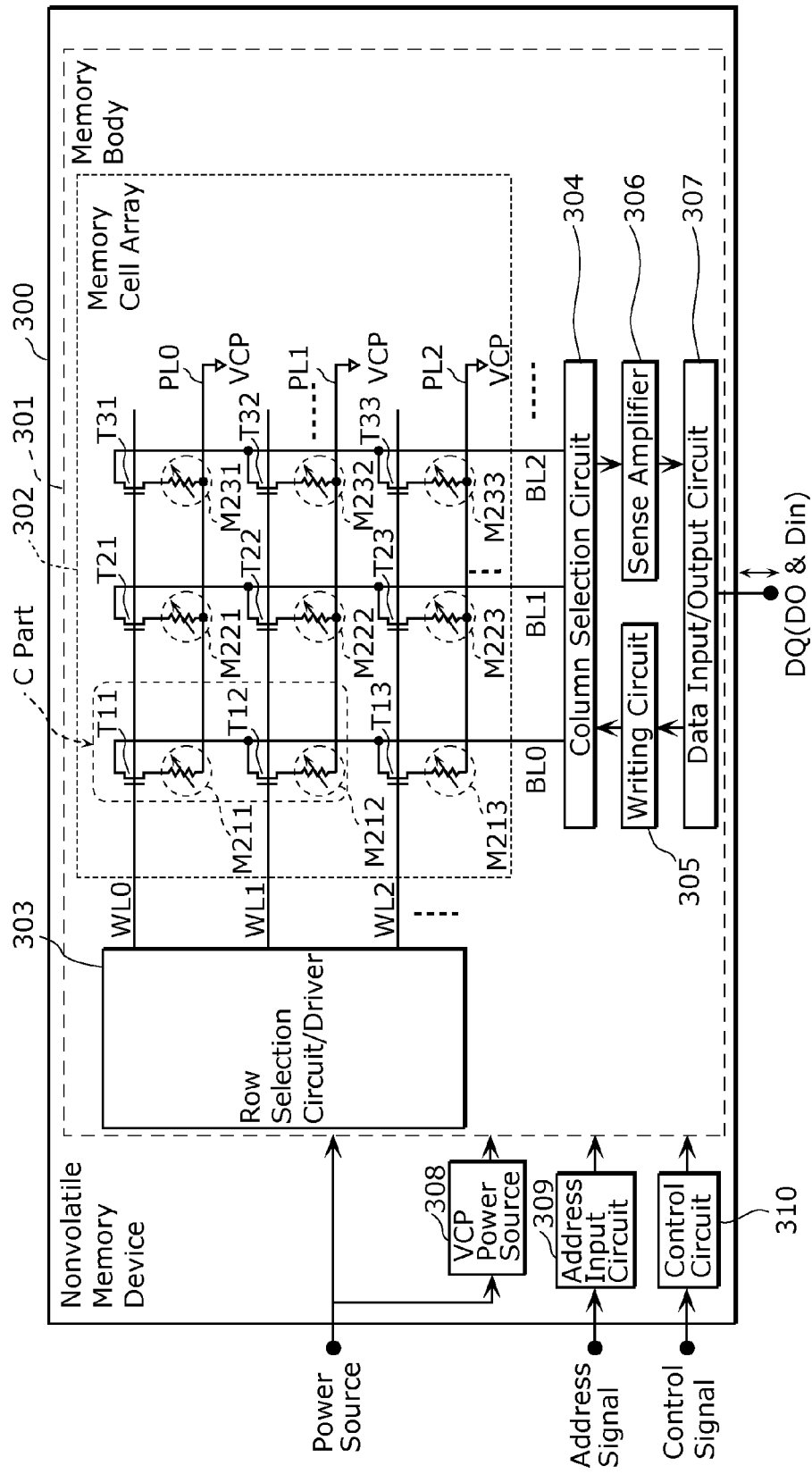

FIG. 15 is a block diagram of a structure example of a nonvolatile memory device including the nonvolatile memory elements according to the embodiment.

Figure 16:
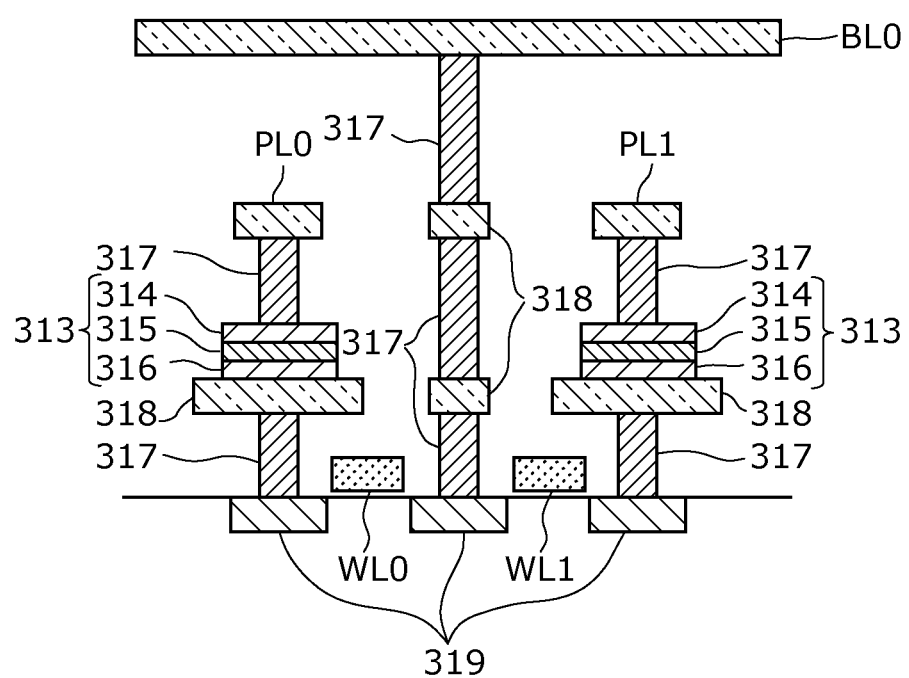

FIG. 16 is a cross-sectional view of a structure of a C part (structure for two bits) in the nonvolatile memory device shown in FIG. 15.

DESCRIPTION OF EMBODIMENT

Prior to the embodiment, the description is given for detailed explanation of characteristics of the conventional nonvolatile memory element disclosed in the "Background" and the problems in the conventional nonvolatile memory device which the inventors have found.

(Structure and Manufacturing Method of Conventional Nonvolatile Memory Element)

Figure 1:
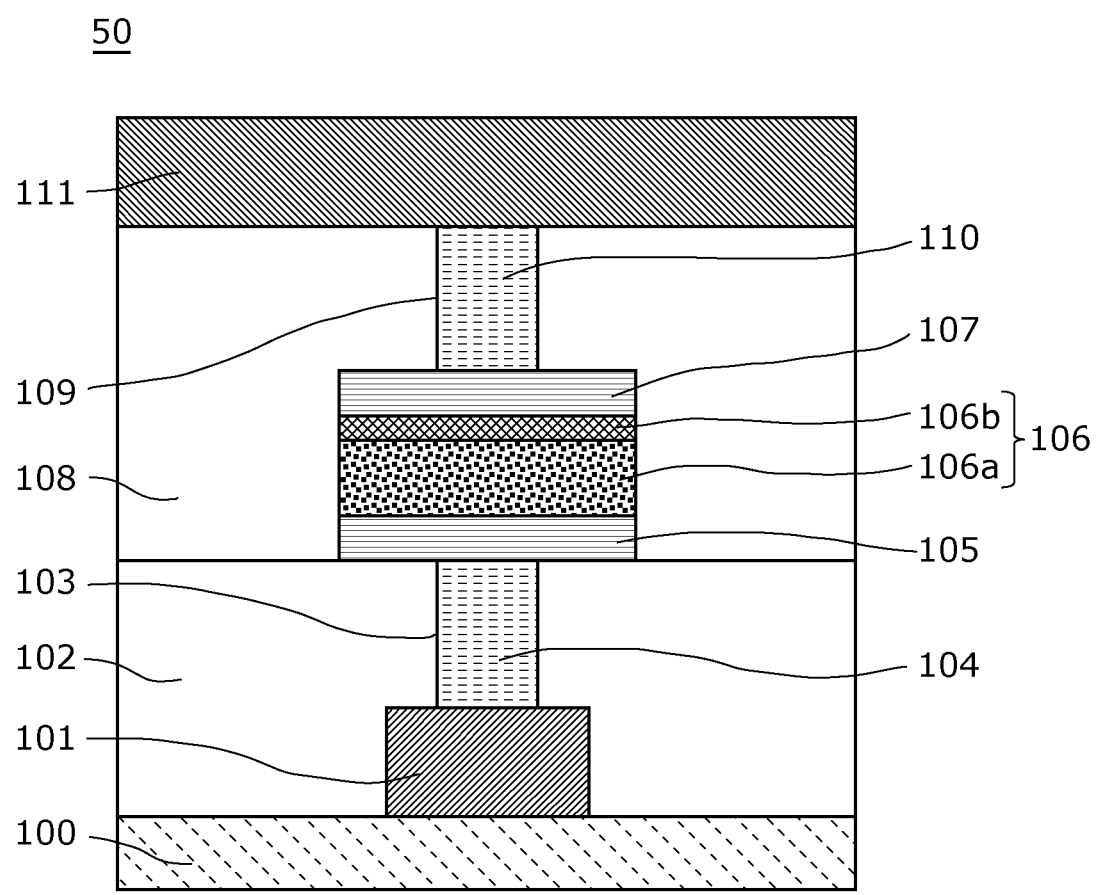
FIG. 1 is a cross-sectional view of a structure example of a conventional nonvolatile memory element.

FIG. 1 is a cross-sectional view of a structure example of the conventional nonvolatile memory element 50.

(a) to (g) in FIG. 2 are cross-sectional views showing an example of a method of manufacturing a main part of the conventional nonvolatile memory element 50. In the following explanation, a structural element having different shapes due to patterning is sometimes assigned with the same reference numeral but with different names before and after the patterning.

As shown in (a) in FIG. 2, a conductive layer comprising aluminium (Al) is formed on the substrate 100 in which a transistor, a lower-layer line, and the like are provided. The conductive layer is patterned to form a first line 101. Furthermore, an insulating film is formed on the substrate 100, covering the first line 101. The surface of the insulating film is smoothed to form a first interlayer insulating layer 102. Then, a desired mask is used to perform patterning, thereby forming a first contact hole 103 that penetrates the first interlayer insulating layer 102 to the first line 101.

Next, as shown in (b) in FIG. 2, a filler comprising mainly tungsten fills the contact hole. Chemical Mechanical Polishing (CMP) is applied to polish the entire wafer to be smoothed. Unnecessary portions of the filler are removed from the top surface of the interlayer insulating film 12, thereby forming a first contact plug 104 in the first contact hole 103.

Next, as shown in (c) in FIG. 2, a first conductive film 105 comprising tantalum nitride is performed by sputtering on the first interlayer insulating layer 102, covering the first contact plug 104.

Next, as shown in (d) in FIG. 2, a first metal oxide 106a and a second metal oxide 106b are sequentially stacked on the first conductive film 105 in order. A oxygen content atomic percentage of the second metal oxide 106b is greater than an oxygen content atomic percentage of the first metal oxide 106a.

For example, regarding the first metal oxide 106a, an oxygen content atomic percentage is in a range from 50 atm % to 65 atm % inclusive, a resistivity is in a range from 2 $\Omega \cdot cm$ to 50 $\Omega \cdot cm$ inclusive, and a thickness is in a range from 20 nm to 100 nm inclusive. In contrast, regarding the second metal oxide 106b, an oxygen content atomic percentage is in a range from 65 atm % to 75 atm % inclusive, a resistivity is $10^7$ $m\Omega \cdot cm$ or more, and a thickness is in a range from 3 nm to 10 nm inclusive.

Next, as shown in (e) in FIG. 2, a second conductive film 107 comprising a noble metal (platinum, iridium, palladium, or the like) is formed on the second metal oxide 106b.

Next, as shown in (f) in FIG. 2, a desired mask is used to pattern the conductive film 107, the first metal oxide 106a, the second metal oxide 106b, and the conductive film 105, thereby forming: a second electrode 107; a variable resistance layer 106 including the first metal oxide 106a and the second metal oxide 106b; and a first electrode 105.

Finally, as shown in (g) in FIG. 2, a second interlayer insulation layer 108 is formed to cover the variable resistance layer 106 and have a thickness in a range, for example, from 500 nm to 1000 nm inclusive. In the same manufacturing method as described in (a) and (b) in FIG. 2, a second contact hole 109 and a second contact plug 110 are formed. After that, a second line 111 is formed, covering the second contact plug 110. Eventually, the nonvolatile memory element 50 is manufactured.

If a variable resistance layer comprises a metal oxide such as a oxygen-deficient tantalum oxide like the variable resistance layer in the conventional nonvolatile memory element 50, the variable resistance layer has a multi-layer structure that includes a layer having a high oxygen content atomic percentage (high oxygen concentration layer, high resistance layer) and a layer having a low oxygen content atomic percentage (low oxygen concentration layer, low resistance layer). As a result, the nonvolatile memory element can provide stable resistance change.

Here, the "oxygen-deficient metal oxide" is defined as a metal oxide having an oxygen content (atomic ratio: a ratio of a total number of oxygen atoms to a total number of atoms) that is lower than that of an metal oxide having a stoichiometric composition. Furthermore, the "oxygen deficient degree" of a metal oxide refers to a ratio of (a) an amount of deficient oxygen to (b) an amount of oxygen included in an oxide of a stoichiometric composition (a stoichiometric composition having the highest resistance value, if there are a plurality of stoichiometric compositions).

For example, in the case of a tantalum oxide, an oxide in a stoichiometric composition is $Ta_2O_5$ in the above definition. Therefore, if the composition is expressed as $TaO_x$, the tantalum oxide is expressed as $TaO_{2.5}$. As a result, a value of x in the oxygen-deficient tantalum oxide is $0<x<2.5$. A range of x varies depending on a valence of a metal in the oxide. In general, a metal oxide having a stoichiometric composition (in particular, a stoichiometric composition having the greatest oxygen content atomic percentage) has insulating properties, and an oxygen-deficient metal oxide has semiconductor properties.

Regarding a nonvolatile memory element in which a variable resistance layer has a multi-layer structure that includes a high oxygen concentration layer and a low oxygen concentration layer, a resistance value in an initial state immediately after manufacturing is higher than a resistance value in a high resistance state in the operable state where normal resistance change is possible. In this state, the resistance is sometimes not changed even with application of electric signal.

In this case, in order to change the nonvolatile memory element to be in the normal operable state, for example, it is necessary that an electric pulse is applied between first and second electrodes sandwiching the variable resistance layer in an initial state, thereby forming a conductive path in the high resistance layer (in other words, it is necessary to breakdown the high resistance layer). Such processing is called initial breakdown. The conductive path formed by the initial breakdown is considered as having a filamentary shape with a diameter of approximately 10 nm.

In the conventional nonvolatile memory element, a voltage of an electric pulse required for the initial breakdown (initial breakdown voltage) is higher than a voltage of an electric pulse required to change the variable resistance layer from a low resistance state to a high resistance state or from a high resistance state to a low resistance state in the normal resistance change operation. Therefore, the conventional initial breakdown has various problems and inconveniences, such as unintended electric damage in the nonvolatile memory element, reduction of efficiency of the initial breakdown, and a need of a special circuit dedicated to generate a high voltage.

Furthermore, as a result of the above examinations, the inventors have newly found that the electric characteristics of the conductive path formed by the initial breakdown significantly depend on a concentrating of a current flowing in the variable resistance layer during the initial breakdown.

If the electric characteristics of the conductive path formed by the initial breakdown vary, currents flowing in respective nonvolatile memory elements are various, and a yield ratio of the nonvolatile memory elements is decreased. Furthermore, characteristics such as pretension (data holding characteristics) and endurance (data rewriting counts) are different depending on nonvolatile memory elements. That further decreases the yield ratio of the nonvolatile memory elements. In particular, if the conductive path is provided near a side surface of an element that is highly likely to be influenced by damages or oxidization occurred in manufacturing the element, characteristics of good resistance change are not obtained. Therefore, the yield ratio would be decreased in the nonvolatile memory element.

Under the observation on these circumstances, one or more exemplary embodiments disclosed herein provide a nonvolatile memory element capable of performing initial breakdown at a lower voltage than a voltage in the conventional technique, and a method of manufacturing the nonvolatile memory element.

In one general aspect, the techniques disclosed here feature a nonvolatile memory element, including: a first electrode; a second electrode; and a variable resistance layer between the first electrode and the second electrode, the variable resistance layer having a resistance value that reversibly changes according to an electrical signal applied between the first electrode and the second electrode, wherein the variable resistance layer includes at least a first variable resistance layer and a second variable resistance layer, the first variable resistance layer comprises a first metal oxide, the second variable resistance layer is planar and includes a first part and a second part, the first part comprising a second metal oxide and being planar, and the second part comprising an insulator and being planar, the second metal oxide has a lower oxygen deficient degree than an oxygen deficient degree of the first metal oxide, and the first part and the second part of the second variable resistance layer are in contact with different parts of a main surface of the first variable resistance layer, the main surface facing the second variable resistance layer.

It is possible that the second variable resistance layer has a thickness in a range from 3 nm to 10 nm inclusive.

It is also possible that the first part and the second part of the second variable resistance layer are in contact with different parts of a main surface of the second electrode, the main surface facing the second variable resistance layer.

It is further possible that the first part of the second variable resistance layer does not include side surfaces of the second variable resistance layer, and the second part of the second variable resistance layer includes the side surfaces of the second variable resistance layer.

It is further possible that the insulator is one of an oxide, a nitride, and an oxynitride.

It is further possible that each of the first metal oxide and the second metal oxide is one of a tantalum oxide, a hafnium oxide, and a zirconium oxide.

It is further possible that the second metal oxide includes a local region having an oxygen deficient degree that reversibly changes according to an applied electric pulse.

It is further possible that a size of the first part is no larger than a half of a size of the second variable resistance layer in length.

It is further possible that the nonvolatile memory element further includes an insulation layer in which the first electrode, the second electrode, and the variable resistance layer are embedded, the insulation layer comprising an insulator different from the insulator in the second part in the variable resistance layer.

It is further possible that a first metal in the first metal oxide is same as a second metal in the second metal oxide.

With the above structure, the second variable resistance layer is provided with the second part comprising the insulator. As a result, the provision of the second variable resistance layer decreases a cross-sectional area of the first part comprising the second metal oxide, namely, an effective path for an operation current in the nonvolatile memory element. As a result, in comparison to the conventional structure without having a part comprising an insulating material in the second variable resistance layer, the nonvolatile memory element according to the present aspect has a less leak current and a higher concentration of the operation current. Therefore, the nonvolatile memory element according to the present aspect can perform initial breakdown at a lower voltage.

In another general aspect, the techniques disclosed here feature a method of manufacturing a nonvolatile memory element, the method including: forming a first electrode above a semiconductor substrate; disposing a first metal oxide on the first electrode; disposing an insulator on the first metal oxide, the insulator being planar; removing a part of the insulator to expose the first metal oxide; disposing a second metal oxide on a part of the first metal oxide from which the part of the insulator is removed, the second metal oxide having a lower oxygen deficient degree than an oxygen deficient degree of the first metal oxide, and the second metal oxide being planar; and forming a second electrode above the insulator and the second metal oxide.

It is possible that in the removing, a through hole is formed in the insulator to expose the first metal oxide, and the disposing of the second metal oxide includes: disposing the second metal oxide in the through hole and over the insulator; and removing a part of the second metal oxide which is over the insulator.

It is also possible that a method of manufacturing a nonvolatile memory element, the method including: forming a first electrode above a semiconductor substrate; disposing a first metal oxide on the first electrode; disposing a second metal oxide on the first metal oxide to be planar, the second metal oxide having a lower oxygen deficient degree than an oxygen deficient degree of the first metal oxide; removing a part of the second metal oxide to expose the first metal oxide; disposing an insulator above a part of the first metal oxide from which the part of the second metal oxide is removed, the insulator being planar; and forming a second electrode above the insulator and the second metal oxide.

It is further possible that the disposing of the insulator includes: forming the insulator over the first metal oxide and the second metal oxide; and removing a part of the insulator which is on the second metal oxide.

It is further possible that the method according further comprises applying an electric pulse between the first electrode and the second electrode to form a local region in the second metal oxide, the local region having an oxygen deficient degree that reversibly changes according to applied electric pulses.

The manufacturing method can offer a nonvolatile memory element having the same advantageous effects as described previously.

Hereinafter, certain exemplary embodiment and its application examples are described in greater detail with reference to the accompanying Drawings. It should be noted that all the embodiment and its application examples described below are specific examples of the present disclosure. Numerical values, shapes, materials, constituent elements, arrangement positions and the connection configuration of the constituent elements, steps, the order of the steps, and the like described in the following embodiment and application examples are merely examples, and are not intended to limit the present disclosure. Therefore, among the constituent elements in the following embodiment and application examples, constituent elements that are not described in independent claims that show the most generic concept of the present disclosure are described as elements constituting more desirable configurations, although such constituent elements are not necessarily required to achieve the object of the present disclosure It should be noted that the same reference numerals are assigned to the identical elements in all the figures, and the explanation of the identical elements are sometimes not given repeatedly.

Embodiment

Structure of Nonvolatile Memory Element (a) in FIG. 3 is a cross-sectional view showing a structure example of a nonvolatile memory element 10 according to the present embodiment, and (b) in FIG. 3 is a plane view of a second variable resistance layer 1062 included in the nonvolatile memory element 10. As shown in FIG. 3, the nonvolatile memory element 10 according to the present embodiment is a variable resistance nonvolatile memory element. The nonvolatile memory element 10 includes a substrate 100, a first line 101, a first interlayer insulating layer 102, a first contact plug 104, a variable resistance element 20, a second interlayer insulation layer 108, a second contact plug 110, and a second line 111.

If the nonvolatile memory elements 10 form a memory cell, one of the first line 101 and the second line 111 is connected to a switch element (a diode or a transistor) not shown. The switch element is set to be OFF while the memory cell is not selected. The switch element may be connected directly to a first electrode 105 or a second electrode 107 in the nonvolatile memory element 10, not through the contact plugs 104 and 110, the first line 101, and the second line 111. The switch element may be a part of the nonvolatile memory element 10.

The substrate 100 is a semiconductor substrate comprising silicon (Si) or the like. The first line 101 is a line formed on the substrate 100. The first interlayer insulating layer 102 is an interlayer insulation layer (for example, having a thickness in a range from 500 nm to 1000 nm inclusive) comprising a silicon oxide or the like that coverts the first line 101 on the substrate 100.

The first contact hole 103 (with a diameter in a range, for example, from 50 nm to 300 nm inclusive) is a contact hole accommodating the contact plug 104 that penetrates the first interlayer insulating layer 102 to be electrically connected with the first line 101. The contact plug 104 is a conductor that is embedded in the first contact hole 103 and comprises mainly tungsten, for example.

The variable resistance element 20 includes the first electrode 105 (with a thickness in a range, for example, from 5 nm to 100 nm inclusive), the variable resistance layer 106 (with a thickness in a range, for example, from 20 nm to 100 nm inclusive), and the second electrode 107 (with a thickness in a range, for example, from 5 nm to 100 nm inclusive). The first electrode 105 is formed on the first interlayer insulating layer 102, covering the first contact plug 104. The first electrode 105 comprises tantalum nitride or the like. The second electrode 107 comprises a noble metal (Pt, Ir, Pd, or the like) or the like. The second interlayer insulation layer 108 (with a thickness in a range, for example, from 500 nm to 1000 nm inclusive) comprises a silicon oxide or the like. The second interlayer insulation layer 108 covers the variable resistance element 20. In other words, the variable resistance element 20 is embedded in the second interlayer insulation layer 108.

The second contact hole 109 (with a diameter in a range, for example, from 50 nm to 300 nm inclusive) penetrates the second interlayer insulation layer 108 to the second electrode 107. The second contact plug 110 is a conductor that is embedded in the second contact hole 109 and comprises mainly tungsten, for example.

The second line 111 is formed on the second interlayer insulation layer 108, covering the second contact plug 110 and three-dimensionally crossing (for example, locating at right angles to) the first line 101.

It should be noted that the nonvolatile memory element 10 may be anything as long as at least the variable resistance element 20 is included. It is also possible that the structural elements (the substrate 100, the first line 101, the first interlayer insulating layer 102, the first contact hole 103, the first contact plug 104, the second interlayer insulation layer 108, the second contact hole 109, the second contact plug 110, and the second line 111) except the variable resistance element 20 may be replaced by other known structural elements or may be omitted, as long as the variable resistance element 20 can operate.

The variable resistance element 20 is described in more detail.

The variable resistance layer 106 is provided between the second electrode 107 and the first electrode 105. The variable resistance layer 106 has a resistance value that reversibly changes based on an electric signal applied between the first electrode 105 and the second electrode 107. More specifically, the variable resistance layer 106, for example, reversibly changes between a high resistance state and a low resistance state according to a polarity of a voltage applied between the first electrode 105 and the second electrode 107. It is also possible that the variable resistance layer 106 may reversibly changes between the high resistance state and the low resistance state depending on values of voltages having the same polarity that are applied between the first electrode 105 and the second electrode 107.

The variable resistance layer 106 has a multi-layer structure that includes at least two layers: a first variable resistance layer 1061 and a second variable resistance layer 1062. The first variable resistance layer 1061 comprises a first metal oxide 106a. The second variable resistance layer 1062 is provided as a planar region. The second variable resistance layer 1062 includes: a first part that comprises a second metal oxide 106b and is planar; and a second part that comprises an insulator 106c and is planar.

The first part and the second part of the second variable resistance layer 1062 are in contact with respective different parts of a main surface (top surface in this example) of the first variable resistance layer 1061 facing the second variable resistance layer 1062. It should be noted that the first part and the second part of the second variable resistance layer 1062 may be in contact with respective different parts of a main surface (bottom surface in this example) of the second electrode 107 facing the second variable resistance layer 1062.

It is further possible that the second metal oxide 106b (the first part) is located in a part closer to the center of the second variable resistance layer 1062 (in other words, located in the central part of the second variable resistance layer 1062 which does not include the side surfaces of the second variable resistance layer 1062), and that the insulator 106c (the second part) is located in a part closer to the periphery of the second variable resistance layer 1062 (in other words, located in a peripheral part of the second variable resistance layer 1062 which surrounds the central part and includes the side surfaces of the second variable resistance layer 1062).

Each of the first metal oxide 106a and the second metal oxide 106b may be a metal oxide mainly comprising, for example, tantalum (Ta). An example of composition and thickness of tantalum oxides serving as the first metal oxide 106a and the second metal oxide 106b will be described in detail after the description for the manufacturing method.

An oxygen deficient degree of the second metal oxide 106b is lower than an oxygen deficient degree of the first metal oxide 106a. Here, the second metal oxide 106b may be a stoichiometric composition. For example, if a tantalum oxide is used, it may be $Ta_2O_5$. A resistance value of the insulator 106c is greater than a resistance value of the second metal oxide 106b.

A size of the second metal oxide 106b (the first part) may be no larger than a half of a size of the second variable resistance layer 1062 in length. For example, it is possible that a length of a side of an inner square shown in the plane view of (b) in FIG. 3 is no more than a half of a length of a side of an outer square.

It is further possible that the second interlayer insulation layer 108 and the insulator 106c (the second part) may comprise different insulating materials.

With the above structure, at the inner side surfaces of the second variable resistance layer 1062, the insulator 106c having a greater resistance value than a resistance value of the second metal oxide 106b is provided. Therefore, in comparison to the case without having the insulator 106c (the conventional structure in which the entire second variable resistance layer 1062 comprises only the second metal oxide 106b), an effective path for an operation current in the nonvolatile memory element 10 has a smaller cross-sectional area. The cross-sectional area of the effective path for an operation current is decreased from a cross-sectional area S1 perpendicular to a current path in the entire second variable resistance layer 1062, to a cross-sectional area S2 perpendicular to a current path in the second part of the second variable resistance layer 1062.

As a result, a concentration of a current flowing from the second metal oxide 106b to the first metal oxide 106a (the first variable resistance layer 1061) is increased. As a result, a conductive path is easily formed in the first metal oxide 106a, so that an initial breakdown voltage of the nonvolatile memory element 10 is decreased and the nonvolatile memory element can perform the initial breakdown at a low voltage.

In other words, most of a current flowing in the second variable resistance layer 1062 that comprises the second metal oxide 106b and the insulator 106c flows in the second metal oxide 106b having a small resistance value (in other words, the central part of the second variable resistance layer 1062). As a result, a concentration of the current flowing from the second variable resistance layer 1062 to the first variable resistance layer 1061 is increased. Therefore, it is possible to initialize the nonvolatile memory element 10 at a lower voltage.

The above describes the mechanism of how the concentration of the current flowing from the second variable resistance layer 1062 to the first variable resistance layer 1061 is increased. The same goes for a current flowing in an opposite direction (in other words, a current flowing from the first variable resistance layer 1061 to the second variable resistance layer 1062).

It should be noted that, although it has been described as one example that the first electrode 105, the first variable resistance layer 1061, the second variable resistance layer 1062, and the second electrode 107 are stacked sequentially upwards in order in the nonvolatile memory device 10, the same goes for a nonvolatile memory element in which these structural elements may be stacked sequentially in opposite order, in other words, in order of the second electrode 107, the second variable resistance layer 1062, the first variable resistance layer 1061, and the first electrode 105 from the bottom. In the nonvolatile memory element having the structural elements stacked in opposite order, the terms such as a bottom surface in the above description is read as a top surface appropriately.

As described above, the first variable resistance layer 1061 comprises the oxygen-deficient first metal oxide 106a, and the second variable resistance layer 1062 comprises: the insulator 106c; and the second metal oxide 106b having an oxygen deficient degree that is lower than that of the first metal oxide 106a. In the second variable resistance layer 1062 in the variable resistance element 106, there is a minute local region having an oxygen deficient degree that reversibly changes according to an applied electric pulse. The local region is considered as including a filament including oxygen defect sites.

The "oxygen deficient degree" of a metal oxide is a ratio of (a) an amount of deficient oxygen to (b) an amount of oxygen included in an oxide of a stoichiometric composition (a stoichiometric composition having the highest resistance value, if there are a plurality of stoichiometric compositions). A metal oxide of a stoichiometric composition is more stable and has a higher resistance value, in comparison to a metal oxide of any other composition.

For example, in the case where a metal is tantalum (Ta), as an oxide of a stoichiometric composition is $Ta_2O_5$ in the above definition, the tantalum oxide is expressed as $TaO_{2.5}$. A oxygen deficient degree of $TaO_{2.5}$ is 0%, and a oxygen deficient degree of $TaO_{1.5}$ is (2.5−1.5)/2.5=40%. Furthermore, an oxygen-excess metal oxide has an oxygen deficient degree having a negative value. In the Specification, oxygen deficient degrees are described as including positive values, zero, and negative values, unless otherwise noted.

An oxide having a low oxygen deficient degree has a high resistance value because it is more similar to an oxide of a stoichiometric composition. On the other hand, an oxide having a high oxygen deficient degree has a low resistance value because it is more similar to a metal included in an oxide.

The "oxygen content atomic percentage" is a ratio of a total number of oxygen atoms to a total number of atoms. For example, an oxygen content atomic percentage of $Ta_2O_5$, which is a ratio of a total number of oxygen to a total number of atoms (O/Ta+O), is 71.4 atm %. Therefore, an oxygen-deficient tantalum oxide has an oxygen content atomic percentage that is greater than 0 and smaller than 71.4 atm %. For example, if a metal included in the first metal oxide layer is the same as a metal included in the second metal oxide layer, the oxygen content atomic percentage corresponds to the oxygen deficient degree. In other words, if the oxygen content atomic percentage of the second metal oxide is greater than the oxygen content atomic percentage of the first metal oxide, the oxygen deficient degree of the second metal oxide is lower than the oxygen deficient degree of the first metal oxide.

The metal included in the variable resistance layer 106 may be a metal that is not tantalum. The metal included in the variable resistance layer may be a transition metal, aluminium (Al), or the like. The transition metal may be tantalum (Ta), titanium (Ti), hafnium (Hf), zirconium (Zr), niobium (Nb), tungsten (W), nickel (Ni), or the like. As the transition metal may be in various oxidation states, it is possible to achieve a different resistance state by oxidation-reduction reaction.

For example, in the case where a hafnium oxide is used, when the first metal oxide 106a has a composition $HfO_x$ where x ranges from 0.9 to 1.6 inclusive, and the second metal oxide 106b has a composition $HfO_y$ where y is greater than x, it is possible to stably and speedily change a resistance value of the variable resistance layer 106. In this case, a thickness of the second metal oxide 106b may be in a range from 3 nm to 4 nm inclusive.

For example, in the case where a zirconium oxide is used, when the first metal oxide 106a has a composition $ZrO_x$ where x ranges from 0.9 to 1.4 inclusive, and the second metal oxide 106b has a composition $ZrO_y$ where y is greater than x, it is possible to stably and speedily change a resistance value of the variable resistance layer 106. In this case, a thickness of the second metal oxide 106b may be in a range from 1 nm to 5 nm inclusive.

It should be noted that a first metal included in the first metal oxide 106a may be different from a second metal included in the second metal oxide 106b. In this case, the second metal oxide 106b may have an lower oxygen deficient degree than that of the first metal oxide 106a, in other words, the second metal oxide 106b has resistance higher than that of the first metal oxide 106a. With the above structure, a voltage applied between the first electrode 105 and the second electrode 107 in changing resistance is distributed more to the second metal oxide 106b. As a result, oxidation-reduction reaction is likely to occur in the second metal oxide second metal oxide 106b.

Furthermore, if the first metal included in the first metal oxide 106a is different from the second metal included in the second metal oxide 106b, a standard electrode potential of the second metal may be lower than that of the first metal. A standard electrode potential having a higher value has characteristics of being more unlikely to be oxidized. Thereby, oxidation-reduction reaction is likely to occur in the second metal oxide that has a relatively low standard electrode potential. It is considered that, in the resistance change phenomenon, oxidation-reduction reaction occurs in a minute local region formed in the second metal oxide 106b having high resistance and thereby a filament (conductive path) is changed, so that the resistance value (oxygen deficient degree) is changed.

For example, the first metal oxide 106a comprises an oxygen-deficient tantalum oxide ($TaO_x$), and the second metal oxide 106b comprises a titanium oxide ($TiO_2$), so that stable resistance change is possible. Titanium (standard electrode potential=−1.63 eV) is a material having a lower standard electrode potential than that of tantalum (standard electrode potential=−0.6 eV). As described above, when the second metal oxide 106b comprises a metal oxide having a standard electrode potential that is lower than a standard electrode potential of the first metal oxide 106a, oxidation-reduction reaction is likely to occur in the second metal oxide 106b. It is also possible that the second metal oxide 106b serving as a high resistance layer comprises a aluminium oxide ($Al_2O_3$) for another combination. For example, it is possible that the first metal oxide 106a comprises an oxygen-deficient tantalum oxide ($TaO_x$) and the second metal oxide 106b comprises an aluminium oxide ($Al_2O_3$).

It is considered that, in the resistance change phenomenon in the variable resistance layer in the multi-layer structure, oxidation-reduction reaction occurs in a minute local region formed in the second metal oxide 106b having high resistance and thereby a filament (conductive path) in the local region is changed, so that the resistance value is changed.

More specifically, when a positive voltage with respect to the first electrode 105 is applied to the second electrode 107 connected to the second metal oxide 106b, oxygen ions in the variable resistance layer 106 are pulled towards the second metal oxide 106b. Therefore, oxidation reaction occurs in the minute local region formed in the second metal oxide 106b, and thereby the oxygen deficient degree is decreased. As a result, it is considered that oxygen defect sites are unlikely to connect to one another to form a filament in the local region, thereby increasing the resistance value.

In contrast, when a negative voltage with respect to the first electrode 105 is applied to the second electrode 107 connected to the second metal oxide 106b, oxygen ions in the second metal oxide 106b are moved towards the first metal oxide 106a. Therefore, oxidation reaction occurs in the minute local region formed in the second metal oxide 106b, and thereby the oxygen deficient degree is increased. As a result, it is considered that oxygen defect sites are likely to connect to one another to form a filament in the local region, thereby decreasing the resistance value.

The second electrode 107 connected to the second metal oxide 106b having the low oxygen deficient degree comprises a material having a higher standard electrode potential than that of the metals included in the second metal oxide 106b, such as platinum (Pt), iridium (Ir), and palladium (Pd), and the material of the first electrode 105. Furthermore, the first electrode 105 connected to the first metal oxide having a higher oxygen deficient degree may comprise a material having a lower standard electrode potential than that of the metal included in the first metal oxide 106a, such as tungsten (W), nickel (Ni), tantalum (Ta), titanium (Ti), aluminium (Al), tantalum nitride (TaN), or titanium nitride (TiN). A standard electrode potential having a higher value has characteristics of being more unlikely to be oxidized.

More specifically, it is possible that Vr2<V2 and V1<V2, where V2 represents a standard electrode potential of the second electrode 107, Vr2 represents a standard electrode potential of a metal included in the second metal oxide 106b, Vr1 represents a standard electrode potential of a metal included in the first metal oxide 106a, and V1 represents a standard electrode potential of the first electrode 105. Furthermore, it is possible that V2>Vr2 and Vr1≥V1. With the above structure, in the second metal oxide 106b near the interface between the second electrode 107 and the second metal oxide 106b, oxidation-reduction reaction selectively occurs to cause stable resistance change phenomenon.

It is further possible that the insulator 106c is one of an oxide, a nitride, and an oxynitride. For example, the insulator 106c may be an aluminium oxide or a titanium oxide.

[First Method of Manufacturing Nonvolatile Memory Element]

(a) to (j) in FIG. 4 are cross-sectional views showing an example of a method of manufacturing a main part of the nonvolatile memory element 10 according to the present embodiment. With reference to the figures, a first method of manufacturing the main part of the nonvolatile memory element 10 according to the present embodiment is described.

As shown in (a) in FIG. 4, on the substrate 100 in which a transistor and a lower-layer line are provided, a conductive layer comprising aluminium (Al) or the like is formed to have a thickness in a rage, for example, from 400 nm to 600 nm. The conductive layer is patterned to be the first line 101.

Next, an insulation layer is formed on the substrate 100 to cover the first line 101 and have a thickness in a range, for example, from 500 nm to 1000 nm inclusive. The surface of the insulation layer is smoothed to form the first interlayer insulating layer 102. The first interlayer insulating layer 102 may comprise plasma Tetraethoxysilane (TEOS) film, a fluorine-containing oxide (for example, Fluorinated Silicate Glass (FSG)) for reducing a parasitic capacitance between lines, and other low-k dielectric material.

Next, a desired mask is used to pattern the first interlayer insulating layer 102, thereby forming the first contact hole 103 that penetrates the first interlayer insulating layer 102 to the first line 101. The first contact hole 103 may be in a cube with sides each ranging, for example, from 50 nm to 300 nm.

If a width of the first line 101 is shorter than a width of the first contact hole 103, mask misalignment changes a contact area between the first line 101 and the first contact plug 104. As a result, for example, a cell current is changed. In order to prevent the above situation, in the present embodiment, the first line 101 has a width greater than a width of the first contact hole 103.

Next, as shown in (b) in FIG. 4, a titanium (Ti) layer serving as an adherence layer and a titanium nitride (TiN) layer serving as a diffusion barrier are formed by spattering as lower layers to have a thickness in a range, for example, from 5 nm to 30 nm inclusive. On the titanium (Ti) layer and the titanium nitride (TiN) layer, a tungsten (W) layer serving as a main structural element of a contact plug is formed by Chemical Vapor Deposition (CVD) to have a thickness in a range, for example, from 200 nm to 400 nm inclusive. In this case, the first contact hole 103 is filled with a conductive layer (a multi-layer structure of the Ti, TiN, and W layers) that is later formed as the first contact plug 104.

Next, the whole surfaces of the wafer is polished to be smoothed by Chemical Mechanical Polishing (CMP), and unnecessary portions of the conductive layer on the first interlayer insulating layer 102 are removed. As a result, the first contact plug 104 is formed in the first contact hole 103.

Next, as shown in (c) in FIG. 4, a conductive layer 105 comprising a tantalum nitride or the like is formed by sputtering on the first interlayer insulating layer 102 to cover the first contact plug 104 and have a thickness in a range, for example, from 20 nm to 100 nm inclusive. It is also possible that, after forming the conductive layer 105, the conductive layer 105 is further smoothed by CMP.

Subsequently, as shown in (d) in FIG. 4, the first metal oxide 106a is formed on the conductive layer 105. For example, a tantalum target may be spattered in an atmosphere of argon and oxygen gas, in other words, reaction sputtering may be used, in order to form $TaO_{x1}$ as the first metal oxide 106a.

As an effective example for obtaining good resistance change characteristics, the first metal oxide 106a may have an oxygen content atomic percentage in a range from 55 atm % to 65 atm % inclusive (a value of x1 in $TaO_{x1}$ is in a range from 1.22 to 1.86 inclusive), a resistivity in a range from 1 mΩ·cm to 50 mΩ·cm inclusive, and a thickness in a range from 20 nm to 100 nm inclusive.

Subsequently, the insulator 106c is formed on the first metal oxide 106a to be planar. For example, a polycrystalline silicon target is spattered in an atmosphere of a mixed gas of argon and nitrogen, in other words, reaction sputtering is used, in order to form a silicon nitride (SiN) as the insulator 106c.

Next, as shown in (e) in FIG. 4, a desired mask (not shown) is applied on the insulator 106c to form a through hole 106b' penetrating to the first metal oxide 106a. In other words, the insulator 106c is partially removed to expose the first metal oxide 106a. A diameter of the through hole 106b' (or a length of one side when the through hole 106b' has a square shape) may be, for example, a minimum manufacturing size defined by process rule.

In this case, in order to prevent etching damage caused by fluorine (F) or the like included in etching gas which enters the first metal oxide 106a and deteriorates the quality of the variable resistance layer, it is desirable that inert gas such as argon (Ar) is used as etching gas. Wet etching using etching liquid including hydrofluoric acid (HF) or the like is also desirable. In the case of Wet etching, fluorine (F) included in etching liquid does not enter the variable resistance layer, so that variable resistance layer is not deteriorated.

Next, as shown in (f) in FIG. 4, the second metal oxide 106b is formed in the through hole 106b' and on the insulator 106c. For example, like the first metal oxide 106a, it is possible that reaction sputtering is performed on a tantalum target in an oxygen gas atmosphere to form $TaO_{x2}$ that serves as the second metal oxide 106b.

After that, as shown in (g) in FIG. 4, etch back is performed to remove the second metal oxide 106b from the top surface of the insulator 106c. As a result, the second metal oxide is formed on the part from which the insulator 106c is removed. By the above-described processing, the second metal oxide 106b is formed in the through hole 106b', being planar. As a result, the entire second variable resistance layer 1062 is formed as a planar region.

As an effective example for obtaining good resistance change characteristics, the second metal oxide 106b may have an oxygen content atomic percentage in a range from 68 atm % to 71 atm % inclusive (a value of x2 in $TaO_{x2}$ is in a range from 2.1 to 2.5 inclusive), a resistivity of $10^7$ mΩ·cm or more. In terms of lowering a voltage for a initial breakdown, a thickness of the second metal oxide 106b may be in a range from 3 nm to 10 nm inclusive. The thickness of the second metal oxide 106b is equal to the thickness of the insulator 106c.

Next, as shown in (h) in FIG. 4, the conductive layer 107 comprising a noble metal (Pt, Ir, Pa, or the like) is formed on the second metal oxide 106b and the insulator 106c.

Next, as shown in (i) in FIG. 4, a desired mask (not shown) is used to perform patterning on the conductive layer 105, the first metal oxide 106a, the insulator 106c, and the conductive layer 107 to form the variable resistance element 20. A diameter of the variable resistance element 20 (or a length of one side when the variable resistance element 20 has a square shape) may be, for example, twice or three times as long as a minimum manufacturing size defined by process rule.

As a result, the formed variable resistance element 20 has a structure in which the variable resistance layer 106 including the first variable resistance layer 1061 and the second variable resistance layer 1062 sequentially stacked is formed between the first electrode 105 and the second electrode 107.

A noble metal representing as a material having a high standard electrode potential is difficult to perform etching thereon. Therefore, if such a noble metal is used for the conductive layer 107, it is possible that the conductive layer 107 is first patterned on the second electrode 107, and the patterned second electrode 107 is used as a hard mask to form the variable resistance element 20.

It should be noted that the conductive layer 105, the first metal oxide 106a, the insulator 106c, and the conductive layer 107 may be patterned together by using the same mask, or may be patterned separately by using different masks.

Finally, as shown in (j) in FIG. 4, the second interlayer insulation layer 108 is formed to cover the variable resistance layer 106 and have a thickness in a range, for example, from 500 nm to 1000 nm inclusive. In the same manufacturing method as shown in (a) and (b) in FIG. 4, the second contact hole 109 and the second contact plug 110 are formed. Like the first interlayer insulating layer 102, the second interlayer insulating layer 108 may comprise plasma TEOS film, a fluorine-containing oxide, or other low-k dielectric material. After that, the second line 111 is formed, covering the second contact plug 109. Eventually, the nonvolatile memory element 10 is manufactured.

[Second Method of Manufacturing Nonvolatile Memory Element]

(a) to (i) in FIG. 5 are cross-sectional views showing the second example of the method of manufacturing a main part of the nonvolatile memory element 10 according to the present embodiment. The same reference numerals in FIG. 4 are assigned to the identical structural elements in FIG. 5, and the identical structural elements are not described again below. The steps (a) to (c) in FIG. 5 are the same as (a) to (c) in FIG. 4, so that they are not explained again.

As shown in (d) in FIG. 5, the first metal oxide 106a is formed on the first electrode 105. For example, it is possible that a tantalum target is spattered in an atmosphere of argon and oxygen gas, in other words, reaction sputtering is used, in order to form $TaO_{x1}$ as the second metal oxide 106a.

As an effective example for obtaining good resistance change characteristics, the first metal oxide 106a may have an oxygen content atomic percentage in a range from 55 atm % to 65 atm % inclusive (a value of x1 in $TaO_{x1}$ is in a range from 1.22 to 1.86 inclusive), a resistivity in a range from 1 mΩ·cm to 50 mΩ·cm inclusive, and a thickness in a range from 20 nm to 100 nm inclusive.

Subsequently, the second metal oxide 106b is formed to be planar. For example, like the first metal oxide 106a, it is possible that reaction sputtering is performed on a tantalum target in an oxygen gas atmosphere to form $TaO_{x2}$ that serves as the second metal oxide 106b.

As an effective example for obtaining good resistance change characteristics, the second metal oxide 106b may have an oxygen content atomic percentage in a range from 68 atm % to 71 atm % inclusive (a value of x2 in $TaO_{x2}$ is in a range from 2.1 to 2.5 inclusive), a resistivity in a range from $10^7$ mΩ·cm or more, and a thickness in a range from 3 nm to 10 nm inclusive.

Next, as shown in (e) in FIG. 5, a desired mask (not shown) is used to partially remove the second metal oxide 106b to expose the first metal oxide 106a. In other words, parts of the second metal oxide 106b are removed to left parts of dots in shape. A diameter of the left second metal oxide 106b (or a length of one side when the left second metal oxide 106b has a square shape) may be, for example, a minimum manufacturing size defined by process rule.

In this case, in order to prevent etching damage caused by fluorine or the like included in etching gas which enters the first metal oxide 106a and deteriorates the quality of the variable resistance layer, it is preferable that inert gas such as argon (Ar) is used as etching gas. Wet etching using etching liquid including hydrofluoric acid (HF) or the like is also desirable. In the case of wet etching, fluorine (F) included in etching liquid does not enter the variable resistance layer, so that variable resistance layer is not deteriorated.

Next, as shown in (f) in FIG. 5, the insulator 106c is formed on the first metal oxide 106a and the second metal oxide 106b. For example, it is possible that polystalline silicon target is spattered in an atmosphere of a mixed gas of argon and nitrogen, in other words, reaction sputtering is used, in order to form SiN as the insulator 106c.

Next, as shown in (g) in FIG. 5, etch back is performed to remove the insulator 106c from the top surface of the second metal oxide 106b. As a result, the insulator 106c is formed on the part in which the second metal oxide 106b is removed from the first metal oxide 106a. By the above-described processing, the insulator 106c is formed to be planar. As a result, the entire second variable resistance layer 1062 is formed as a planar region. Next, the conductive layer 107 comprising a noble metal (Pt, Ir, Pa, or the like) is formed on the second metal oxide 106b and the insulator 106c.

Next, as shown in (h) in FIG. 5, a desired mask (not shown) is used to perform patterning on the conductive layer 105, the first metal oxide 106a, the insulator 106c, and the conductive layer 107 to form the variable resistance element 20. A diameter of the variable resistance element 20 (or a length of one side when the variable resistance element 20 has a square shape) may be, for example, twice or three times as long as a minimum manufacturing size defined by process rule.

As a result, the formed variable resistance element 20 has a structure in which the variable resistance layer 106 including the first variable resistance layer 1061 and the second variable resistance layer 1062 sequentially stacked is located between the first electrode 105 and the second electrode 107.

A noble metal representing as a material having a high standard electrode potential or the like is difficult to perform etching thereon. Therefore, if such a noble metal is used for the conductive layer 107, it is possible that the conductive layer 107 is first patterned on the second electrode 107, and the patterned second electrode 107 is used as a hard mask to form the variable resistance element 20.

It should be noted that the conductive layer 105, the first metal oxide 106a, the insulator 106c, and the conductive layer 107 may be patterned together by using the same mask, or may be patterned separately by using different masks.

Finally, as shown in (i) in FIG. 5, the second interlayer insulation layer 108 is formed to cover the variable resistance layer 106 and have a thickness in a range, for example, from 500 nm to 1000 nm inclusive. In the same manufacturing method as shown in (a) and (b) in FIG. 5, the second contact hole 109 and the second contact plug 110 are formed. After that, the second line 111 is formed, covering the second contact plug 110. Eventually, the nonvolatile memory element 10 is manufactured.

[Lowering of Initial Breakdown Voltage]

FIG. 6 is a graph plotting an initial breakdown voltage in the nonvolatile memory element 10 according to the present embodiment (Present Embodiment) and an initial breakdown voltage in the conventional nonvolatile memory element 50 (Conventional Example). In each of the conventional example and the present embodiment, a range of variations of measured initial breakdown voltages is shown by an error bar, and an average value of the initial breakdown voltages is shown by a white circle. The initial breakdown voltage in the present embodiment is significantly lower than that in the conventional example.

As described above, in the nonvolatile memory element 10 in which the second variable resistance layer 1062 includes the second metal oxide 106b and the insulator 106c, an effective path for an operation current has a smaller cross-sectional area than that of the nonvolatile memory element 50. As a result, it is possible to reduce a leak current, and significantly lowering an initial breakdown voltage.

[Decrease in Variations of Variable Resistance Characteristics]

Next, the description is given for resistance change in the case where an electric pulse is applied to the nonvolatile memory element 10 according to the present embodiment.

FIG. 7 is a graph plotting an example of a relationship between a resistance value and a pulse application count in the nonvolatile memory element 10. FIG. 7 shows an example of variations of the resistance value of the nonvolatile memory element 10 in the case where electric pulses having the same pulse width of 100 ns and different polarities are alternately applied between the first electrode 105 and the second electrode 107 (hereinafter, referred to simply as "between the electrodes") of the nonvolatile memory element 10.

By alternately applying electric pulses having different polarities between the electrodes, the resistance value of the nonvolatile memory element 10 reversibly changes. More specifically, in FIG. 7, when a negative voltage pulse (with a voltage of −1.5 V and a pulse width of 100 ns) is applied between the electrodes, the resistance value of the nonvolatile memory element 10 is decreased to approximately ten thousand Ω (low resistance value), and when a positive voltage pulse (with a voltage of +2.4 V and a pulse width of 100 ns) is applied between the electrodes, the resistance value is increased to several hundreds of thousand Ω (high resistance value).

Here, regarding a polarity of a voltage, a voltage that is positive for the second electrode 107 with respect to the first electrode 105 is defined as a "positive voltage", and a voltage that is negative for the second electrode 107 with respect to the first electrode 105 is defined as a "negative voltage". Hereinafter, the voltage polarities are defined as above. It should be noted that the results shown in FIG. 7 are measured values of a sample in which a diameter of the variable resistance layer 106 is 0.5 μm, a thickness of the first variable resistance layer 1061 is approximately 45 nm, and a thickness of the second variable resistance layer 1062 is 5 nm.

FIG. 8 is a graph plotting a distribution of an operation current (a current provided to change the resistance value of the variable resistance layer) in each of the nonvolatile memory element 10 according to the present embodiment (Present Embodiment) and the conventional nonvolatile memory element 50 (Conventional Example). Here, an LR current refers to a current provided to change the variable resistance layer to have a low resistance value, while an HR current refers to a current provided to change the variable resistance layer to a high resistance value. In each of the conventional example and the present embodiment, for each of the HR current and the LR current, a range of variations of measured currents is shown by an error bar, and an average value of the current values is shown by a white circle.

In comparison to the nonvolatile memory element 50 as the comparison example, variations in both the LR current and the HR current are smaller in the nonvolatile memory element 10 according to the present embodiment. The reasons of the reduction in the variations of the LR currents and the HR current are that, in the nonvolatile memory element 10, a conductive path is formed in a region of the second metal oxide 106b, namely, the central part of the second variable resistance layer 1062, but a conductive path is not formed in the side surface part that is likely to be affected by damage or oxidation in manufacturing the element in the same manner as the nonvolatile memory element 50. As the same reasons, the nonvolatile memory element 10 can reduce not only variations of the current value but also the variations of the resistance value, more than the nonvolatile memory element 50 can do.

[Operation Example of Nonvolatile Memory Element]

Next, the description is given for an operation example of the nonvolatile memory element according to the present embodiment which serves as a memory, in other words, an operation example of writing and reading data, with reference to the drawings.

FIG. 9 is a graph plotting the operation example of writing data into the nonvolatile memory element 10.

As shown in FIG. 9, when two kinds of electric pulses having an amplitude of a predetermined threshold voltage or higher, a pulse width of 100 ns, and different polarities are alternately applied between the first electrode 105 and the second electrode 107, the resistance value of the variable resistance layer 106 is changed. In other words, if a negative voltage pulse (with a voltage E1 and a pulse width of 100 ns) is applied between electrodes, the resistance value of the variable resistance layer 106 is decreased from a high resistance value Rb to a low resistance value Ra. On the other hand, if a positive voltage pulse (with a voltage E2 and a pulse width of 100 ns) is applied between electrodes, the resistance value of the variable resistance layer 106 is increased from the low resistance value Ra to the high resistance value Rb. The voltage E1 is, for example, −1.5 V, and the voltage E2 is, for example, +2.4 V.

In the example shown in FIG. 9, the high resistance value Rb is allocated+ to data "0", and the low resistance value Ra is allocated to data "1". Therefore, if a positive voltage pulse is applied between the electrodes to change the resistance value of the variable resistance layer to the high resistance value Rb, data "0" is written. If a negative voltage pulse is applied between the electrodes to change the resistance value of the variable resistance layer to the low resistance value Ra, data "1" is written.

FIG. 10 is a graph plotting an operation example of reading data from the nonvolatile memory element according to the present embodiment.

As shown in FIG. 10, when data is to be read, a reading voltage E3 (|E3|<|E1|, |E3|<|E2|, for example, 0.5 V) having an amplitude that is much smaller than an electric pulse applied to change the resistance value of the variable resistance layer is applied between the electrodes. As a result, a current corresponding to the resistance value of the variable resistance layer is provided, and a value of the provided current is detected, thereby making it possible to read the written data.

In the example shown in FIG. 10, an output current value Ia corresponds to the resistance value Ra, and an output current value Ib corresponds to the resistance value Rb. Therefore, the data "1" is read out when the output current value Ia is detected, while the data "0" is read out when the output current value Ib is detected.

As described above, in a region between the first electrode 105 and the second electrode 107, the variable resistance layer functions as a memory unit. As a result, the nonvolatile memory device 10 operates as a memory.

(First Application Example of Nonvolatile Memory Element)

The following describes, as the first application example of the nonvolatile memory element according to the present embodiment, a nonvolatile memory device in which each of the nonvolatile memory elements includes a single diode and a single variable resistance element.

[Structure of Nonvolatile Memory Device according to First Application Example]

FIG. 11 is a block diagram of a structure of the first application example of the nonvolatile memory device including the nonvolatile memory elements according to the present embodiment. FIG. 12 is an oblique perspective view of a structure of an A part (structure for four bits) in the nonvolatile memory device shown in FIG. 11. The present application example is a nonvolatile memory device including crosspoint memory cells each having a nonvolatile memory element in which a variable resistance element is connected in series with a diode.

As shown in FIG. 11, the nonvolatile memory device 200 according to the present application example includes a memory body 201 on a semiconductor substrate. The memory body 201 includes a memory cell array 202, a row selection circuit/driver 203, a column selection circuit/driver 204, a writing circuit 205 for writing data, a sense amplifier 206 that detects a current amount flowing in a selected bit line to determine whether or not data is "1" or "0", and a data input/output circuit 207 that inputs and outputs data via a terminal DQ. The nonvolatile memory device 200 further includes: an address input circuit 208 that receives an address signal from the outside; and a control circuit 209 that controls operations of the memory body 201 based on a control signal provided from the outside.

As shown in FIGS. 11 and 12, the memory cell array 202 includes a plurality of word lines (first lines) WL0, WL1, WL2, . . . and a plurality of bit lines (second lines) BL0, BL1, BL2, . . . . The word lines WL0, WL1, WL2, . . . are arranged in parallel to one another on the semiconductor substrate. Above the word lines WL0, WL1, WL2, . . . , the bit lines BL0, BL1, BL2, . . . are arranged in parallel to one another on the plane in parallel to the main surface of the semiconductor substrate, so as to three-dimensionally cross the word lines WL0, WL1, WL2, . . . , respectively. In this example, the respective word lines cross at right angles to the respective bit lines.

The memory cell array 202 also includes a plurality of memory cells M111, M112, M113, M121, M122, M123, M131, M132, M133, . . . which are arranged in a matrix corresponding to respective crosspoints between the word lines WL0, WL1, WL2, . . . and the bit lines BL0, BL1, BL2, . . . .

Here, each of the memory cells M111, M112, . . . includes the above-described nonvolatile memory element 10 according to the present embodiment and a current steering element connected in series with the nonvolatile memory element 10. Each of the nonvolatile memory elements includes a variable resistance layer having a multi-layer structure of oxygen-deficient metal oxides.

Furthermore, each of the memory cells M111, M112, . . . in FIG. 11 is shown as the memory cell 210 in FIG. 12.

[Structure of Nonvolatile Memory Element in Nonvolatile Memory Device according to First Application Variation]

FIG. 13 is a cross-sectional view of a structure of the nonvolatile memory element in the nonvolatile memory device shown in FIG. 11 according to the first application example. FIG. 13 shows a structure of a B part in FIG. 12.

As shown in FIG. 13, in the nonvolatile memory device according to the present application example, the nonvolatile memory element 210 is provided between a lower line 212 comprising a copper (corresponding to the word line WL1 in FIG. 14) and an upper line 211 (corresponding to a bit line BL1 in FIG. 14). In the nonvolatile memory element 210, there are a lower electrode 217, a current steering layer 216, an inner electrode 215, a variable resistance layer 214, and an upper electrode 213 which are sequentially stacked.

Here, the internal electrode 215, the variable resistance layer 214, and the upper electrode 213 correspond to the first electrode 105, the variable resistance layer 106, and the second electrode 107, respectively, in the nonvolatile memory element 10 according to the present embodiment shown in (a) in FIG. 3. Therefore, the structure of the present application example is manufactured in the same manner as the structure according to the present embodiments.

The current steering element 216 is connected in series with the variable resistance layer 214 via the inner electrode 215 comprising TaN. The current steering layer 216 and the variable resistance layer 214 are electrically connected to each other. The current steering element that includes the lower electrode 217, the current steering layer 216, and the inner electrode 215 is an element represented by a Metal-Insulator-Metal (MIM) diode or a Metal-Semiconductor-Metal (MSM) diode. The current steering element has liner current characteristics with respect to voltages. In a MSM diode, a larger amount of current can flow than a MIM diode. An example of the current steering layer 216 may be amorphous Si or the like. This current steering element has bi-directional current characteristics with respect to voltages, and is conductive at a predetermined threshold voltage Vf (for example, in a range from +1 V to −1 V inclusive with reference to one of the electrodes).

It should be noted that a tantalum and a tantalum oxide are materials that are generally used in semiconductor, so that they have significantly high affinity. Therefore, it is possible to easily introduce a tantalum and a tantalum oxide into existing semiconductor manufacturing.

[Structural Example of Nonvolatile Memory Device Having Multi-Layer Structure]

A plurality of the memory cell arrays in the nonvolatile memory device according to the present application example as shown in FIGS. 11 and 12 are three-dimensionally stacked to manufacture a nonvolatile memory device having a multi-layer structure.

FIG. 14 is an oblique perspective view of a memory cell array having a multi-layer structure of a plurality of the memory cell arrays of the nonvolatile memory device according to the first application example shown in FIG. 12. As shown in FIG. 14, the nonvolatile memory device includes a multi-layer memory cell array in which a plurality of memory cell arrays are stacked. Each of the memory cell arrays includes a plurality of lower lines (first lines) 212, a plurality of upper lines (second lines) 211, and a plurality of memory cells 210. The lower lines 212 are arranged in parallel to one another on a semiconductor substrate (not shown). Above the lower lines 212, the upper lines 211 are arranged in parallel to one another on the plane in parallel to the main surface of the semiconductor substrate, so as to three-dimensionally cross the lower lines 212, respectively. The memory cells 210 are provided at respective crosspoints between the lower lines 212 and the upper lines 211 to form a matrix.

It should be noted that, in the example shown in FIG. 14, there are five line layers, and four layers of the nonvolatile memory elements arranged at crosspoints between lines, but, of course, the number of the line layers or the layers of the nonvolatile memory elements may be increased or decreased as needed.

The multi-layer memory cell array having the above structure allows the nonvolatile memory to have an extremely large capacity.

As described in the present embodiment, the variable resistance layer according to the present embodiment can be manufactured at a low temperature. Therefore, even in the case of including the step of forming lines to have a multi-layer structure as described in the present embodiment, the step of forming the multi-layer lines does not affect materials of transistors and materials of lines such as silicide, which are formed in the step of manufacturing a lower layer. As a result, a multi-layer memory cell array can be easily manufactured. In other words, the use of the variable resistance layer comprising a tantalum oxide according to the present embodiment allows the nonvolatile memory device to easily have the multi-layer structure.

(Second Application Example of Nonvolatile Memory Element)

The following describes, as the second application example of the nonvolatile memory element according to the present embodiment, a nonvolatile memory device in which each of the nonvolatile memory elements includes a single transistor and a single variable resistance element.

[Structure of Nonvolatile Memory Device according to Second Application Example]

FIG. 15 is a block diagram showing a structure of a second application example of a nonvolatile memory device including the nonvolatile memory elements according to the present embodiment. FIG. 16 is an oblique perspective view showing a structure of a C part (structure for two bits) in the nonvolatile memory device shown in FIG. 15. The present application example is a nonvolatile memory device including 1 transistor-1 nonvolatile memory element (1T1R) memory cells each having a nonvolatile memory element that includes a variable resistance element and a transistor.

As shown in FIG. 15, the nonvolatile memory device 300 according to the present application example includes a memory body 301 on a semiconductor substrate. The memory body 301 includes a memory cell array 302, a row selection circuit/driver 303, a column selection circuit 304, a writing circuit 305 for writing data, a sense amplifier 306 that detects a current amount flowing in a selected bit line to determine whether or not data is "1" or "0", and a data input/output circuit 307 that inputs and outputs data via a terminal DQ. The nonvolatile memory device 300 further includes: a cell plate power source (VCP power source) 308; an address input circuit 309 that receives an address signal from the outside; and a control circuit 310 that controls operations of the memory body 301 based on a control signal provided from the outside.

The memory cell array 302 includes a plurality of word lines (first lines) WL0, WL1, WL2, . . . , a plurality of bit lines (second lines) BL0, BL1, BL2, . . . , a plurality of transistors T11, T12, T13, T21, T22, T23, T31, T32, T33, . . . , a plurality of memory cells M211, M212, M213, M221, M222, M223, M231, M232, M233, . . . . The word lines WL0, WL1, WL2, . . . and the bit lines BL0, BL1, BL2, . . . are provided on the semiconductor substrate and arranged to cross each other. The transistors T11, T12, T13, T21, T22, T23, T31, T32, T33, . . . are provided at respective crosspoints between the word lines and the bit lines. The memory cells M211, M212, M213, M221, M222, M223, M231, M232, M233, . . . are provided to correspond to the transistors T11, T12, T13, T21, T22, T23, T31, T32, T33, . . . , respectively. In this example, the respective word lines cross at right angles to the respective bit lines.

The memory cell array 302 includes a plurality of plate lines (third lines) PL0, PL1, PL2, . . . which are arranged in parallel to the word lines WL0, WL1, WL2, . . . . As shown in FIG. 16, above the word lines WL0 and WL1, the bit line BL0 is provided. Between the bit line BL0 and the word lines WL0 and WL1, there are plate lines PL0 and PL1. It should be noted that, in the above structure example, the plate lines are in parallel to the word lines, but the plate lines may be in parallel to the bit lines. It should be noted that it has been described that the plate lines apply the same potential to all the transistors, but it is also possible that a plate line selection circuit/driver having the same structure as that of the row selection circuit/driver is provided to drive a selected plate line and non-selected plate lines at different voltages (with different polarities).

Here, each of the memory cells M211, M212, . . . corresponds to the nonvolatile memory element 10 according to the present embodiment. Each of the nonvolatile memory elements has a variable resistance layer having a multi-layer structure comprising oxygen-deficient metal oxides. More specifically, the nonvolatile memory element 313 in FIG. 16 corresponds to each of the memory cells M211, M212, . . . in FIG. 15, and the nonvolatile memory element 313 includes: an upper electrode 314; a variable resistance layer 315 having a multi-layer structure comprising oxygen-deficient metal oxides; and a lower electrode 316. FIG. 16 further includes a plug layer 317, a metal line layer 318, and a source or drain region 319.

As shown in FIG. 15, drains of the transistors T11, T12, T13, . . . are connected to the bit line BL0, drains of the transistors T21, T22, T23, . . . are connected to the bit lines BL1, and drains of the transistors T31, T32, T33, . . . are connected to the bit line BL2.

Gates of the transistors T11, T21, T31, . . . are connected to the word line WL0, gates of the transistors T12, T22, T32, . . . are connected to the word line WL1, and gates of the transistors T13, T23, T33, . . . are connected to the word line WL2.

Furthermore, sources of the transistors T11, T12, . . . are connected to the memory cells M211, M212, . . . , respectively.

The memory cells M211, M221, M231, . . . are connected to the plate line PL0, the memory cells M212, M222, M232, . . . are connected to the plate line PL1, and the memory cells M213, M223, M233, . . . are connected to the plate line PL2.

The address input circuit 309 receives an address signal from an external circuit (not shown). Based on the address signal, the address input circuit 309 provides a row address signal to the row selection circuit/driver 303 and a column address signal to the column selection circuit 304. Here, the address signal indicates an address of a certain memory cell selected from the memory cells M211, M212, . . . . The row address signal indicates a row address of the address indicated by the address signal, and the column address signal indicates a column address of the address indicated by the address signal.

In a data writing cycle, the control circuit 310 provides the writing circuit 305 with a writing signal instructing application of a writing voltage, based on input data Din provided to the data input/output circuit 307. On the other hand, in a data reading cycle, the control circuit 310 provides the column selection circuit 304 with a read signal instructing application of a read voltage.

The row selection circuit/driver 303 receives the row address signal from the address input circuit 309. Based on the row address signal, the row selection circuit/driver 303 selects one of the word lines WL0, WL1, WL2, . . . , and applies a predetermined voltage to the selected word line.

On the other hand, the column selection circuit 304 receives the column address signal from the address input circuit 309. Based on the column address signal, the column selection circuit 304 selects one of the bit lines BL0, BL1, BL2, . . . and applies a writing voltage or a read voltage to the selected bit line.

When the writing circuit 305 receives the writing signal from the control circuit 310, the writing circuit 305 issues a signal instructing application of the writing voltage to the selected bit line to the column selection circuit 304.

In a data reading cycle, the sense amplifier 306 detects an amount of a current flowing in the selected bit line from which data is to be read, and determines whether the data is "1" or "0". The resulting output data DO is provided to an external circuit via the data input/output circuit 307.

It should be noted that the second application example having a structure of 1T1R nonvolatile memory element does not have a multi-layer structure and therefore has a smaller amount of a memory capacity than that of the crosspoint nonvolatile memory element according to the first application example. However, the second application example does not need a current steering element such as a diode. Therefore, the second application example can be easily combined with the method of CMOS manufacturing. In addition, it is also possible to easily control the operations of the second application example.

Moreover, like the first application example, the variable resistance layer according to the present embodiment can be manufacture at a low temperature. Therefore, even in the case of including the step of forming lines to have a multi-layer structure as described in the present application example, the step of forming the multi-layer lines does not affect materials of transistors and materials of lines such as silicide, which are formed in the step of manufacturing a lower layer.

Also, like the first application example, forming of a tantalum oxide and a tantalum oxide can be easily introduced in existing semiconductor manufacturing methods. Therefore, the nonvolatile memory device according to the present application example can be easily manufactured.

It should be noted that it has been described in the above embodiment that a metal oxide used in the variable resistance layer is a tantalum oxide, a hafnium oxide, or a zirconium oxide. However, the metal oxide layer between the first electrode and the second electrode, which serves as the main variable resistance layer with resistance change, may also comprise a small amount of the other element, as long as the metal oxide layer comprises a tantalum oxide layer, a hafnium oxide layer, a zirconium oxide layer, or the like are included. It is also possible to purposely include a small amount of other element in the metal oxide layer to slightly adjust the resistance value, for example. This case is also included in the scope of the present disclosure. For example, addition of nitrogen into the variable resistance layer increases the resistance value of the variable resistance layer to improve reaction of resistance change.

Furthermore, when the variable resistance layer is formed by spattering, residual gas or gas released from a wall of a vacuum case causes unintended element of a small amount to be mixed into the variable resistance layer. Such mixture of element of a small amount is, of course, included in the scope of the present disclosure. Although only exemplary embodiment and its application examples of the present disclosure have been described in detail above, those skilled in the art will readily appreciate that many modifications are possible in the exemplary embodiment and its application examples without materially departing from the novel teachings and advantages of the present disclosure. Accordingly, all such modifications are intended to be included within the scope of the present disclosure.

INDUSTRIAL APPLICABILITY

The present disclosure provides a variable resistance semiconductor memory element and a method of manufacturing a nonvolatile memory device including the memory elements. The present disclosure can offer a nonvolatile memory that stably operates and have a high reliability. The present disclosure is useful in various electronic devices including nonvolatile memories.

What is claimed is:

1. A nonvolatile memory element, comprising:
a first electrode;
a second electrode; and
a variable resistance layer between the first electrode and the second electrode, the variable resistance layer having a resistance value that reversibly changes according to an electrical signal applied between the first electrode and the second electrode,
wherein the variable resistance layer includes at least a first variable resistance layer and a second variable resistance layer,
the first variable resistance layer comprises a first metal oxide,
the second variable resistance layer is planar and includes a first part and a second part, the first part comprising a second metal oxide and being planar, and the second part comprising an insulator and being planar,
the second metal oxide has a lower oxygen deficient degree than an oxygen deficient degree of the first metal oxide, and
the first part and the second part of the second variable resistance layer are in contact with different parts of a main surface of the first variable resistance layer, the main surface facing the second variable resistance layer.

2. The nonvolatile memory element according to claim 1, wherein the second variable resistance layer has a thickness in a range from 3 nm to 10 nm inclusive.

3. The nonvolatile memory element according to claim 1, wherein the first part and the second part of the second variable resistance layer are in contact with different parts of a main surface of the second electrode, the main surface facing the second variable resistance layer.

4. The nonvolatile memory element according to claim 1, wherein the first part of the second variable resistance layer does not include side surfaces of the second variable resistance layer, and the second part of the second variable resistance layer includes the side surfaces of the second variable resistance layer.

5. The nonvolatile memory element according to claim 1, wherein the insulator is one of an oxide, a nitride, and an oxynitride.

6. The nonvolatile memory element according to claim 1, wherein each of the first metal oxide and the second metal oxide is one of a tantalum oxide, a hafnium oxide, and a zirconium oxide.

7. The nonvolatile memory element according to claim 1, wherein the second metal oxide includes a local region having an oxygen deficient degree that reversibly changes according to an applied electric pulse.

8. The nonvolatile memory element according to claim 1, wherein a size of the first part is no larger than a half of a size of the second variable resistance layer in length.

9. The nonvolatile memory element according to claim 1, further comprising
an insulation layer in which the first electrode, the second electrode, and the variable resistance layer are embedded, the insulation layer comprising an insulator different from the insulator in the second part in the variable resistance layer.

10. The nonvolatile memory element according to claim 1, wherein a first metal in the first metal oxide is same as a second metal in the second metal oxide.

11. The nonvolatile memory element according to claim 1, wherein a first metal in the first metal oxide is different from a second metal in the second metal oxide.

* * * * *